(12) United States Patent
Lee et al.

(10) Patent No.: US 12,538,618 B2
(45) Date of Patent: Jan. 27, 2026

(54) DISPLAY DEVICE

(71) Applicant: Samsung Display Co., LTD., Yongin-si (KR)

(72) Inventors: Jin Hyeong Lee, Suwon-si (KR); Dae Won Kim, Hwaseong-si (KR); Su Jeong Kim, Seoul (KR); Jong Ho Son, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 986 days.

(21) Appl. No.: 17/591,869

(22) Filed: Feb. 3, 2022

(65) Prior Publication Data

US 2022/0384683 A1 Dec. 1, 2022

(30) Foreign Application Priority Data

May 31, 2021 (KR) .......................... 10-2021-0069808

(51) Int. Cl.
*H10H 20/831* (2025.01)
*H10H 20/814* (2025.01)
(Continued)

(52) U.S. Cl.
CPC ........ *H10H 20/831* (2025.01); *H10H 20/814* (2025.01); *H10H 20/851* (2025.01); *H10H 29/142* (2025.01)

(58) Field of Classification Search
CPC ............... H01L 25/0753; H01L 25/167; H01L 2224/24051; H01L 2924/12041; H10H 20/812; H10H 20/814; H10H 20/831; H10H 20/851; H10H 29/142; H10H 29/8513; H10H 20/856; H10H 20/0361;
(Continued)

(56) References Cited

U.S. PATENT DOCUMENTS 10,903,446 B2 1/2021 Son et al.
11,476,439 B2 10/2022 Son et al.
(Continued)

FOREIGN PATENT DOCUMENTS

KR 10-2009-0073895 7/2009
KR 10-2020-0083875 A 7/2020
(Continued)

OTHER PUBLICATIONS

Machine translation of WO 2020085606 A1 (Year: 2020).*
Machine translation (Year: 2020).*

*Primary Examiner* — Mark W Tornow
*Assistant Examiner* — Priya M Rampersaud
(74) *Attorney, Agent, or Firm* — Womble Bond Dickinson (US) LLP

(57) ABSTRACT

A display device includes a plurality of electrodes disposed on a substrate and spaced apart from each other, a plurality of light-emitting elements disposed between the plurality of electrodes, a planarization layer disposed on the plurality of light-emitting elements, a lower reflective layer disposed on the planarization layer and comprising a first opening overlapping the plurality of light-emitting elements in a plan view, a wavelength conversion layer disposed on the lower reflective layer, and a functional layer disposed on the wavelength conversion layer and comprising a second opening overlapping the first opening in a plan view.

24 Claims, 28 Drawing Sheets

(51) Int. Cl.
*H10H 20/851* (2025.01)
*H10H 29/14* (2025.01)

(58) Field of Classification Search
CPC .. H10H 20/0363; H10H 20/835; H10H 20/84; H10H 20/8513; H10H 20/882; H10H 20/819; H10H 20/8515; H10K 59/122; H10K 59/878; H10K 59/805; H10K 59/8792; H10K 50/856; H10K 59/38; H10K 59/873; H10K 50/865; H10K 59/12; H10K 50/844; H10K 59/351; H10K 59/40; H10K 59/35; H10K 59/8791; H10K 59/80515; H10K 2102/3026; G02F 1/133553; G02F 2203/02; G02F 1/133512; G02F 1/133514; G02F 1/1336; G02F 1/133614; H05B 33/145; H05B 33/02; H05B 33/24

See application file for complete search history.

(56) References Cited

U.S. PATENT DOCUMENTS

| | | | |
|---|---|---|---|
| 11,621,305 B2 | 4/2023 | Park et al. | |
| 2018/0045866 A1* | 2/2018 | Chae | G02F 1/133553 |
| 2018/0314107 A1* | 11/2018 | Park | G02F 1/133617 |
| 2019/0006328 A1* | 1/2019 | Chen | H10D 86/60 |
| 2020/0013990 A1* | 1/2020 | Ueda | H10K 59/877 |
| 2020/0258945 A1* | 8/2020 | Joo | H10D 30/6723 |
| 2021/0132723 A1* | 5/2021 | Kim | H10K 59/878 |
| 2021/0351238 A1* | 11/2021 | Park | H10K 59/878 |
| 2022/0393068 A1 | 12/2022 | Kim et al. | |

FOREIGN PATENT DOCUMENTS

| | | | |
|---|---|---|---|
| KR | 10-2020-0104451 | 9/2020 | |
| KR | 10-2021-0031586 | 3/2021 | |
| KR | 10-2022-0165862 | 12/2022 | |
| WO | WO-2020085606 A1 * | 4/2020 | G02B 1/04 |

* cited by examiner

FIG. 1
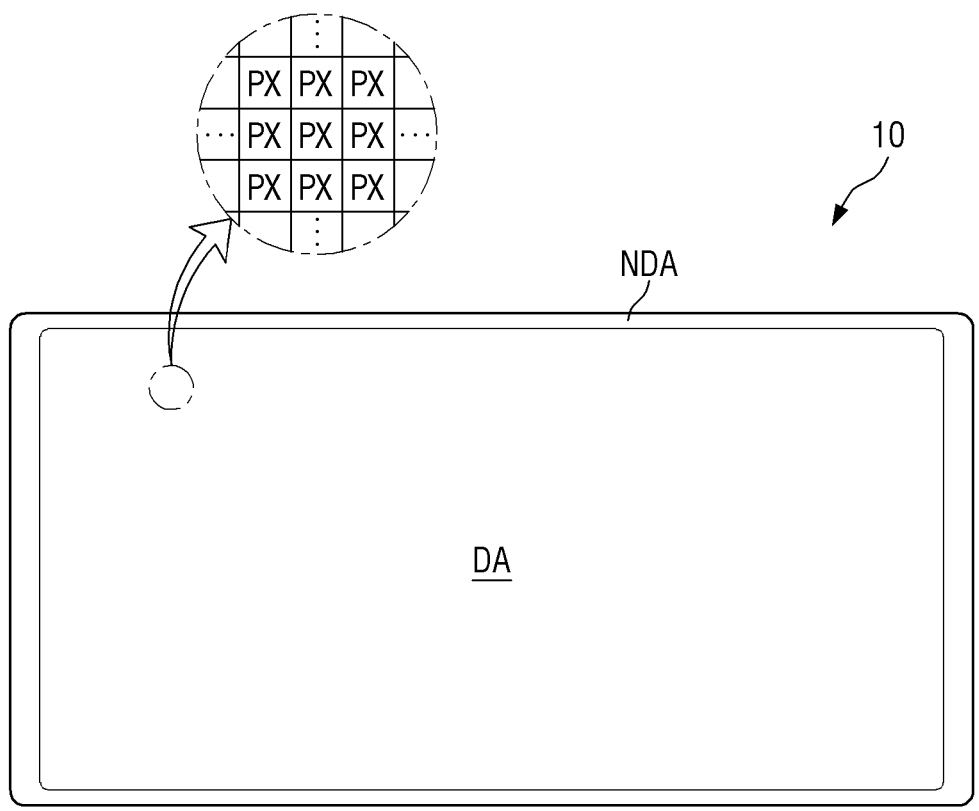
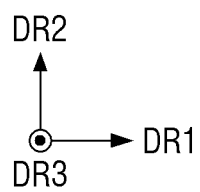

FIG. 22
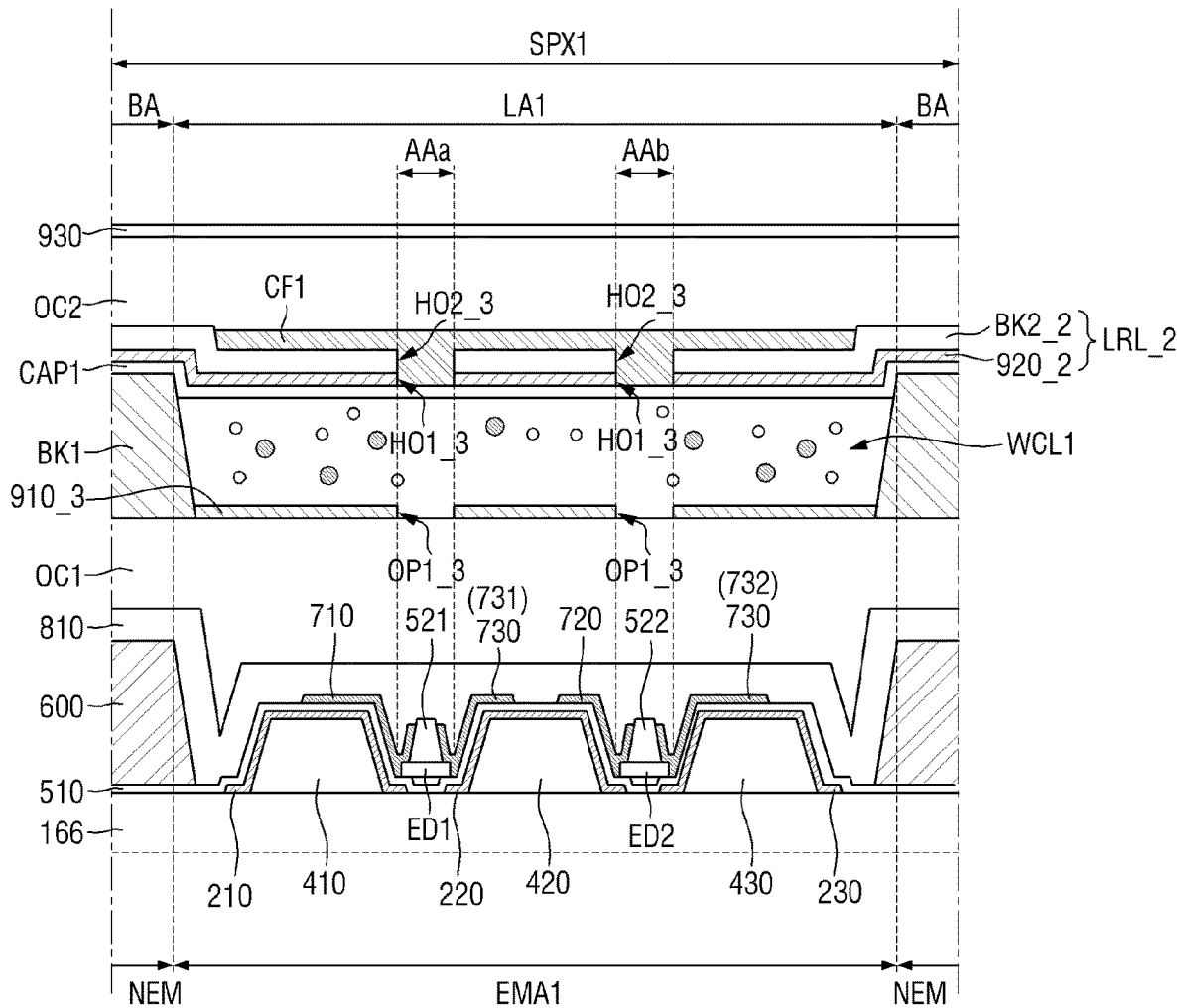
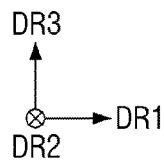
200_1: 210, 220, 230
400_1: 410, 420, 430
700_1: 710, 720, 730
520_1: 521, 522
ED_1: ED1, ED2
AA1_1: AAa, AAb
OP2_3: HO1_3, HO2_3

DISPLAY DEVICE

CROSS-REFERENCE TO RELATED APPLICATION(S)

This application claims priority to and the benefit of Korean Patent Application No. 10-2021-0069808 under 35 U.S.C. 119, filed on May 31, 2021, in the Korean Intellectual Property Office (KIPO), the entire contents of which are incorporated herein by reference.

BACKGROUND

1. Technical Field

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices include a display panel such as an organic light-emitting display panel and a liquid-crystal display panel for displaying images. A light-emitting display panel may include light-emitting elements, which may be light-emitting diodes (LEDs). Examples of the light-emitting diodes may include an organic light-emitting diode using an organic material as a light-emitting material, an inorganic light-emitting diode using an inorganic material as a light-emitting material, etc.

SUMMARY

Aspects of the disclosure provide a display device having improved display quality by reducing reflection of outside light to increase the efficiency of outputting light.

It should be noted that objects of the disclosure are not limited to the above-mentioned object; and other objects of the invention will be apparent to those skilled in the art from the following descriptions.

According to an aspect of the disclosure, there is provided a display device including a substrate; a plurality of electrodes disposed on a substrate and spaced apart from each other; a plurality of light-emitting elements disposed between the plurality of electrodes; a planarization layer disposed on the plurality of light-emitting elements; a lower reflective layer disposed on the planarization layer and comprising a first opening overlapping the plurality of light-emitting elements in a plan view; a wavelength conversion layer disposed on the lower reflective layer; and a functional layer disposed on the wavelength conversion layer and comprising a second opening overlapping the first opening in a plan view.

The functional layer may include an upper reflective layer disposed on the wavelength conversion layer; and a first light-blocking member disposed on the upper reflective layer. The upper reflective layer may include a first hole overlapping the first opening in a plan view, the first light-blocking member may include a second hole overlapping the first hole in a plan view, and the second opening may include the first hole and the second hole.

The display device may further include a second light-blocking member disposed on the planarization layer and surrounding the wavelength conversion layer. The functional layer may be disposed on the second light-blocking member.

The second light-blocking member may be disposed on the lower reflective layer.

The second light-blocking member may surround the lower reflective layer.

A shape of the first opening may be identical to a shape of the second opening in a plan view.

An area of the second opening may be less than or equal to an area of the first opening.

The plurality of electrodes may include a first electrode and a second electrode extended in a first direction and spaced apart from each other in a second direction intersecting the first direction, the plurality of light-emitting elements may include first light-emitting elements spaced apart from each other in the first direction in a first alignment area between the first electrode and the second electrode, and the first opening and the second opening may overlap the first alignment area in a plan view.

A shape of the first alignment area may have a shape extended in the first direction in a plan view, and a shape of the first opening or the second opening may have a shape extended in the first direction in a plan view.

The plurality of electrodes may include a third electrode extended in the first direction and spaced apart from the first electrode and the second electrode in the second direction with the second electrode disposed between the first and third electrode, the plurality of light-emitting elements may include second light-emitting elements spaced apart from each other in the first direction in a second alignment area between the second electrode and the third electrode, and the first opening and the second opening may overlap the second alignment area in a plan view.

The second alignment area may be spaced apart from the first alignment area and have a shape extended in the first direction, and the first opening and the second opening may have a shape of stripes extended in the first direction and spaced apart from each other in the second direction.

According to another aspect of the disclosure, there is provided a display device including an emission layer disposed on a substrate and comprising a plurality of light-emitting elements disposed in first and second alignment areas; a wavelength control layer disposed above the emission layer and comprising a lower reflective layer and a wavelength conversion layer; and an upper reflective layer disposed on the wavelength control layer. The lower reflective layer may include a first opening overlapping the first and second alignment area in a plan view, the wavelength conversion layer may be disposed on the lower reflective layer in first and second light exit areas overlapping the first and second alignment areas in a plan view, respectively, the upper reflective layer may include a first hole overlapping the first opening in a plan view, and an area of the first hole is equal to or less than an area of the first opening.

The display device may further include a first light-blocking member disposed on the upper reflective layer and comprising a second hole overlapping each of the first and second alignment areas in a plan view. The first hole and the second hole may overlap each other in a plan view.

The emission layer may further include a third alignment area in which the plurality of light-emitting elements is disposed, the wavelength control layer may further include a transparent layer disposed in a third light exit area overlapping the third alignment area in a plan view; and a second light-blocking member disposed in a light-blocking area surrounding the first to third light exit areas, and the second light-blocking member may surround the wavelength conversion layer and the transparent layer.

The lower reflective layer may be disposed in the first to third light exit areas and the light-blocking area.

The second light-blocking member may be disposed on the lower reflective layer.

The lower reflective layer may be disposed in the first to third light exit areas but not in the light-blocking area.

The second light-blocking member may surround the lower reflective layer.

The lower reflective layer may be disposed in the first and second light exit areas but not in the third light exit area or in the light-blocking area.

The emission layer may further include a first electrode and a second electrode disposed on the substrate, extended in a first direction, and spaced apart from each other in a second direction intersecting the first direction. The light-emitting elements may be spaced apart from each other in the first direction between the first electrode and the second electrode, and the first opening may have a shape extended in the first direction or a shape of dots spaced apart from each other in the first direction in a plan view.

According to yet another aspect of the disclosure, there is provided a display device including a substrate; an emission layer comprising an alignment area in which a plurality of light-emitting elements is disposed on a substrate; a lower reflective layer disposed on the emission layer; a wavelength conversion layer disposed on the lower reflective layer; an upper reflective layer disposed on the wavelength conversion layer and comprising a first hole overlapping the alignment area in a plan view; a light-blocking member disposed on the upper reflective layer and comprising a second hole overlapping the first hole in a plan view; and a color filter layer disposed on the light-blocking member.

The lower reflective layer may include a first opening overlapping the alignment area in a plan view.

The first hole and the second hole may have a same shape in a plan view, and the first hole and the second hole may overlap the first opening in a plan view.

The details of one or more embodiments of the subject matter described in this specification are set forth in the accompanying drawings and the description below.

According to an embodiment of the disclosure, a lower reflective layer may be disposed at the bottom of a wavelength conversion layer and a transparent layer in according to display device, and a functional layer including an upper reflective layer and a light-blocking member may be disposed on the wavelength conversion layer and the transparent layer. Accordingly, at least some of light emitted from the light-emitting elements and incident on the wavelength conversion layer and the transparent layer can be recycled. In this manner, the efficiencies of converting and outputting light can be improved.

According to an embodiment of the disclosure, as a first opening included in a lower reflective layer and a second opening included in a functional layer overlap each other, the reflection of outside light that is incident from the outside of the display device and is reflected by the lower reflective layer can be reduced, so that the display quality of the display device can be improved.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which:

FIG. 1 is a schematic plan view of a display device according to an embodiment of the disclosure.

FIG. 22 is a schematic cross-sectional view schematically illustrating a first sub-pixel according to the embodiment of FIG. 19.

DETAILED DESCRIPTION OF THE EMBODIMENTS

Figure 2:
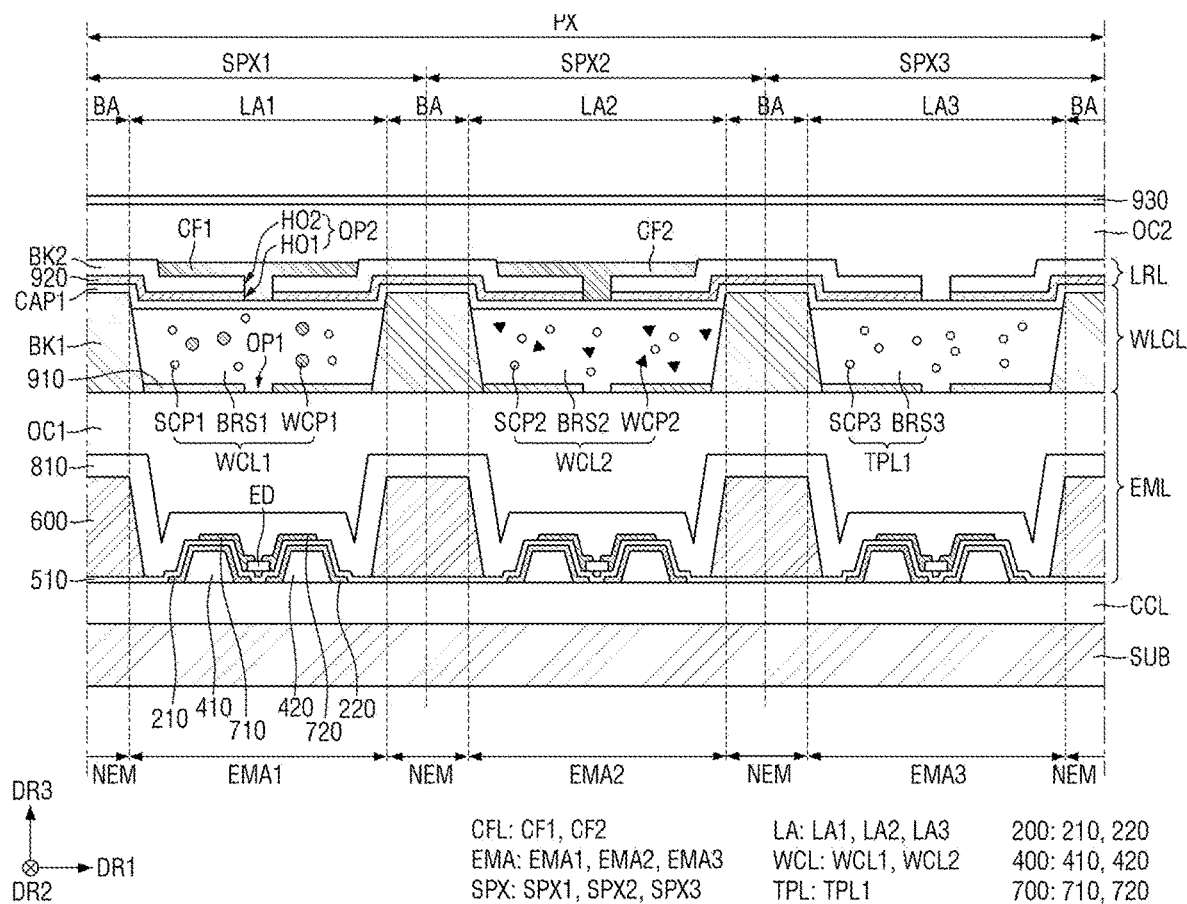
FIG. 2 is a schematic cross-sectional view illustrating a pixel of a display device according to an embodiment of the disclosure.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

FIG. 1 is a schematic plan view of a display device according to an embodiment.

Referring to FIG. 1, a display device 10 displays a moving image or a still image. The display device 10 may refer to any electronic device that provides a display screen. For example, the display device 10 may include a television set, a laptop computer, a monitor, an electronic billboard, an Internet of things (IoT) device, a mobile phone, a smartphone, a tablet personal computer (PC), an electronic watch, a smartwatch, a watch phone, a head-mounted display device, a mobile communication terminal, an electronic notebook, an electronic book, a portable multimedia player (PMP), a navigation device, a game console and a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the disclosure is not limited thereto. Any other display panel may be employed as long as the technical idea of the disclosure can be equally applied thereto.

A first direction DR1, a second direction DR2 and a third direction DR3 are defined in the drawings. The display device 10 according to the embodiments of the disclosure will be described with reference to the drawings. The first direction DR1 may be perpendicular to the second direction DR2 in a plane The third direction DR3 may be perpendicular to the plane defined by the first direction DR1 and the second direction DR2. The third direction DR3 may be perpendicular to each of the first direction DR1 and the second direction DR2. In the following description of the display devices 10 according to the embodiments of the disclosure, the third direction DR3 refers to the thickness direction of the display device 10.

The display device 10 may have a rectangular shape including longer sides in the first direction DR1 and shorter sides in the second direction DR2 when viewed from the top (or in a plan view). Although the corners where the longer sides and the shorter sides of the display device 10 meet each other may form a right angle, this is merely illustrative. The display device 1 may have rounded corners. The shape of the display device 10 in a plan view is not limited to that shown in FIG. 1. The display device 10 may have other shapes such as a square, a rectangle (or quadrilateral) with rounded corners (vertices), quadrilateral, other polygons, and a circle.

A display surface of the display device 10 may be located on a side of the display device 10 in the third direction DR3, e.g., the thickness direction. In the following description, the upper side of the display device 10 refers to the side in the third direction DR3 where images are displayed, and the upper surface of the display device 10 refers to a surface facing the side in the third direction DR3, unless specifically stated otherwise. The lower side thereof refers to an opposite side in the third direction DR3, and likewise the lower surface thereof refers to a surface facing the opposite side in the third direction DR3. As used herein, the terms "left," "right," "upper" and "lower" sides refer to relative positions when the display device 10 is viewed from the top. For example, the right side refers to a side in the first direction DR1, the left side refers to the other side in the first direction DR1, the upper side refers to a side in the second direction DR2, and the lower side refers to the other side in the second direction DR2.

The display device 10 may include a display area DA and a non-display area NDA. In the display area DPA, images can be displayed. In the non-display area NDA, images are not displayed.

The shape of the display area DA may follow the shape of the display device 10. For example, the shape of the display area DA may have a rectangular shape generally similar to the shape of the display device 10 in a plan view. The display area DA may generally occupy the center of the display device 10.

The display area DA may include pixels PX. Each of the pixels PX may refer to a repeating minimum unit for displaying images. The pixels PX may be arranged in a matrix. The shape of each of the pixels PX may be rectangular or square in a plan view. It is, however, to be understood that the disclosure is not limited thereto. The shape of each of the pixels PX may have a diamond (or rhombic_shape having sides inclined with respect to a direction. The pixels PX may be alternately arranged in a stripe or PenTile® pattern.

The non-display areas NDA may be disposed around the display area DA. The non-display area NDA may surround the display area DA entirely or partially. In an embodiment, the display area DA may have a rectangular shape, and the non-display areas NDA may be disposed to be adjacent to the four sides of the display area DA. The non-display area NDA may form the bezel of the display device 10. Lines, circuit drivers included in the display device 10, or pad areas on which external devices are mounted may be disposed in the non-display areas NDA.

FIG. 2 is a cross-sectional view schematically illustrating a pixel of a display device according to an embodiment.

Referring to FIG. 2, in order to display full-color images, each of the pixels PX may include sub-pixels SPX that emits light of different colors. For example, each of the pixels PX may include a first sub-pixel SPX1 responsible for emitting light of a first color, a second sub-pixel SPX2 responsible for emitting light of a second color, and a third sub-pixel SPX3 responsible for emitting light of a third color. For example, the first color may be red, the second color may be green, and the third color may be blue. Although a pixel PX includes three sub-pixels SPX in the drawings, the disclosure is not limited thereto. For example, each of the pixels PX may include a greater number of sub-pixels SPX.

The display area DA (see FIG. 1) of the display device 10 may include light exit areas LA and a light-blocking area BA. In the light exit areas LA, the light generated from an emission layer (or emission material layer) EML is provided to the outside of the display device 10. In the light-blocking area BA, the light generated from the emission layer EML is not provided to the outside of the display device 10.

The light exit areas LA may include a first light exit area LA1, a second light exit area LA2, and a third light exit area LA3. The first light exit area LA1 may be the light exit area LA of the first sub-pixel SPX1, the second light exit area LA2 may be the light exit area LA of the second sub-pixel SPX2, and the third light exit area LA3 may be the light exit area LA of the third sub-pixel SPX3. The first light exit area LA1 may output light of the first color, the second light exit area LA2 may output light of the second color, and the third light exit area LA3 may output light of the third color. For example, the first color may be red, the second color may be green, and the third color may be blue. It is, however, to be understood that the disclosure is not limited thereto.

The light-blocking area BA may be disposed to surround the first light exit area LA1, the second light exit area LA2, and the third light exit area LA3. The first light exit area LA1, the second light exit area LA2 and the third light exit area LA3 may be distinguished by the light-blocking area BA.

The display device 10 may include a substrate SUB, a circuit element layer CCL, an emission layer EML, a wavelength control layer WLCL, a functional layer LRL, and a color filter layer CFL.

The substrate SUB may be a base substrate or a base member. The substrate SUB may be made of an insulating material such as glass, quartz and a polymer resin. The substrate SUB may be either a rigid substrate or a flexible substrate that can be bent, folded, or rolled.

The circuit element layer CCL may be disposed on the substrate SUB. The circuit element layer CCL may be disposed on a surface of the substrate SUB to drive the pixels SPX. The circuit element layer CCL may include at least one transistor to drive the emission layer EML.

The emission layer EML may be disposed on the circuit element layer CCL. The emission layer EML may include sub-pixels SPX each including a first electrode, an emission layer, and a second electrode. In some embodiments, the emission layer may include an inorganic light-emitting diode. However, the disclosure is not limited thereto. In some other embodiments, the emission layer may include an organic light-emitting diode.

The emission layer EML may include emission areas EMA and a non-emission area NEM located in the display area DA. In the emission areas EMA, light emitted from the emission layer EML is provided to the wavelength control layer WLCL. In the non-emission area NEM, light emitted from the emission layer EML is not provided to the wavelength control layer WLCL.

The emission areas EMA may include a first emission area EMA1, a second emission area EMA2, and a third emission area EMA3. The first emission area EMA1 may be the emission area EMA of the first sub-pixel SPX1, the second emission area EMA2 may be the emission area EMA of the second sub-pixel SPX2, and the third emission area EMA3 may be the emission area EMA of the third sub-pixel SPX3.

The first emission area EMA1 may overlap the first light exit area LA1, the second emission area EMA2 may overlap the second light exit area LA2, and the third emission area EMA3 may overlap the third light exit area LA3.

As will be described below, light-emitting diodes ED may be disposed in the emission areas EMA of the sub-pixels SPX, and the light-emitting diodes ED may emit light in a particular wavelength range. In an embodiment, the light-emitting diodes ED disposed in each of the first to third emission areas EMA1, EMA2, and EMA3 may emit light of the same wavelength range. For example, light emitted by the light-emitting diodes ED disposed in each of the first to third emission areas EMA1, EMA2, and EMA3 may be light of the third color, e.g., blue light.

The non-emission area NEM may be disposed to surround the first emission area EMA1, the second emission area EMA2, and the third emission area EMA3. The first emission area EMA1, the second emission area EMA2, and the third emission area EMA3 may be distinguished by the non-emission area NEM.

The emission layer EML may include a first bank 400, a second bank 600, an electrode layer 200, contact electrodes 700, light-emitting diodes ED, and a first insulating layer 510. The emission layer EML may further include a protective layer 810 and a first planarization layer OC1.

The first bank 400 may be disposed on the circuit element layer CCL. The first bank 400 may be disposed in each of the first to third emission areas EMA1, EMA2 and EMA3, which are the emission areas EMA of the first to third sub-pixels SPX1, SPX2, and SPX3, respectively. The first bank 400 disposed in each of the first to third emission areas EMA1, EMA2 and EMA3 may include sub-banks. The sub-banks may be spaced apart from each other. For example, the first bank 400 may include a first sub-bank 410 and a second sub-bank 420 spaced apart from each other.

The electrode layer 200 may be disposed on the first bank 400. The electrode layer 200 may include a first electrode 210 and a second electrode 220 spaced apart from each other. The first electrode 210 may be disposed on the first sub-bank 410, and the second electrode 220 may be disposed on the second sub-bank 420.

The first insulating layer 510 may be disposed on the electrode layer 200. The first insulating layer 510 may protect the electrode layer 200 and may insulate the first electrode 210 and the second electrode 220 from each other.

The second bank 600 may be disposed on the first insulating layer 510. The second bank 600 may be disposed in the non-emission area NEM along the borders of the first to third sub-pixels SPX1, SPX2, and SPX3. The second bank 600 may include an opening exposing the first bank 400 and the light-emitting diodes ED disposed in each of the first to third emission areas EMA1, EMA2 and EMA3. During an inkjet printing process for aligning the light-emitting diodes ED among processes of fabricating the display device 10, the second bank 600 may work as partition walls which prevent that ink in which the light-emitting diodes ED are dispersed is mixed into adjacent sub-pixels SPX, so that the ink can be ejected into the emission areas EMA.

The light-emitting diodes ED may be disposed on the first insulating layer 510. The light-emitting diodes ED may be disposed in each of the first to third emission areas EMA1, EMA2 and EMA3. The light-emitting diodes ED may be disposed between the first sub-bank 410 and the second sub-bank 420 in the emission area EMA of each sub-pixel SPX. The light-emitting diodes ED may be disposed such that both ends thereof are placed on the first electrode 210 and the second electrode 220, respectively.

Each of the light-emitting diodes ED may emit light in a particular wavelength range. For example, the light-emitting diodes ED may emit light of the third color or blue light having a peak wavelength in a range of about 480 nm or less, preferably about 445 nm to about 480 nm or less.

The contact electrodes 700 may be disposed on the light-emitting diodes ED. The contact electrodes 700 may electrically connect the first and second electrodes 210 and 220 with the light-emitting diodes ED.

The contact electrodes 700 may include a first contact electrode 710 and a second contact electrode 720 spaced apart from each other. The first contact electrode 710 and the second contact electrode 720 may be electrically insulated from each other.

The first contact electrode 710 may be disposed on the first electrode 210, and the second contact electrode 720 may be disposed on the second electrode 220. The first contact electrode 710 may electrically connect the first electrode 210 with first ends of the light-emitting diodes ED. The second contact electrode 720 may electrically connect the second electrode 220 with second ends of the light-emitting diodes ED.

The protective layer 810 may be disposed on the contact electrodes 700. The protective layer 810 may be disposed to cover the entire surface of the substrate SUB. The protective layer 810 may cover the first bank 400, the electrode layer 200, the light-emitting diodes ED, the contact electrodes 700, and the second bank 600 disposed under the protective layer 810.

The protective layer 810 may include an inorganic insulating material or an organic insulating material. The protective layer 810 may serve to protect elements disposed under the protective layer 810 from particles (or foreign substances) such as moisture or oxygen and dust particles.

The first planarization layer OC1 may be disposed on the protective layer 810. The first planarization layer OC1 may have a generally flat surface regardless of the shape or presence of patterns disposed thereunder. In other words, the first planarization layer OC1 may provide a flat surface over the protective layer 810 or planarize an upper side of the protective layer 810.

The first planarization layer OC1 may include an organic material. For example, the first planarization layer OC1 may be at least one of an acrylic resin, an epoxy resin, a phenolic resin, a polyamide resin, and a polyimide resin.

The circuit element layer CCL and the emission layer EML will be described in detail below with reference to FIGS. 3 to 5.

The wavelength control layer WLCL may be disposed on the emission layer EML. The wavelength control layer WLCL may include a first light-blocking member BK1, a lower reflective layer 910, a wavelength conversion layer WCL, a transparent layer TPL and a first capping layer CAP1.

The first light-blocking member BK1 may be disposed on the first planarization layer OC1. The first light-blocking member BK1 may be disposed in the light-blocking area BA along the borders of the first to third sub-pixels SPX1, SPX2, and SPX3. The first light-blocking member BK1 may not overlap the first to third light exit areas LA1, LA2, and LA3. The first light-blocking member BK1 may be disposed to partition the first to third light exit areas LA1, LA2, and LA3 to define the first to third light exit areas LA1, LA2, and LA3 and the light-blocking area BA. The first light-blocking member BK1 may overlap the second bank 600 in the thickness direction of the display device 10 (e.g., in the third direction DR3).

The first light-blocking member BK1 can block the transmission of light. The first light-blocking member BK1 can improve the color gamut by preventing rays of light from intruding into a space between the first to third light exit areas LA1, LA2, and LA3 and being mixed with each other. The first light-blocking member BK1 may be made of (or include) a material including an organic material. In an embodiment, the first light-blocking member BK1 may include a light-absorbing material that absorbs light in the visible wavelength range.

The lower reflective layer 910 may be disposed on the first planarization layer OC1. The lower reflective layer 910 may include a first opening OP1 located in the light exit areas LA.

The lower reflective layer 910 may reflect some of rays of light which travel toward the upper side from the wavelength conversion layer WCL, and some of the rays of light is reflected by an upper reflective layer 920. The lower reflective layer 910, together with the upper reflective layer 920, can recycle rays of light incident on the wavelength conversion layer WCL in the wavelength conversion layer WCL, so that it is possible to improve the efficiency of converting light, as will be described below.

The lower reflective layer 910 may include a reflective material. The lower reflective layer 910 may be made of, for example, aluminum (Al), nickel (Ni), lanthanum (La), silver (Ag) or an alloy thereof, or a material including metal such as indium tin oxide (ITO), indium zinc oxide (IZO), and indium tin zinc oxide (ITZO). It is, however, to be understood that the disclosure is not limited thereto.

The wavelength conversion layer WCL and the transparent layer TPL may be disposed on the lower reflective layer 910. The wavelength conversion layer WCL may convert the wavelength of the light incident thereon, and the transparent layer TPL may transmit the light incident thereon without converting the wavelength of the light.

The wavelength conversion layer WCL or the transparent layer TPL may be disposed separately in each of the first to third sub-pixels SPX1, SPX2, and SPX3. The wavelength conversion layer WCL or the transparent layer TPL may be disposed in each of the light exit areas LA, e.g., the first to third light exit areas LA1, LA2, and LA3 of the first to third sub-pixel SPX1, SPX2, and SPX3. A wavelength conversion layer WCL and/or transparent layer TPL adjacent to each other may be spaced apart from each other by the first light-blocking member BK1 disposed in the light-blocking area BA.

The wavelength conversion layer WCL may be disposed in a sub-pixel SPX in which rays of light incident from the emission layer EML include light of a color different from the color of the sub-pixel SPX and thus it is necessary to convert the wavelength of the light incident from the emission layer EML. The transparent layer TPL may be disposed in a sub-pixel SPX in which a color of light incident from the emission layer EML has the same as the color of the sub-pixel SPX. In an embodiment, the wavelength conversion layer WCL may be disposed in each of the first sub-pixel SPX1 and the second sub-pixel SPX2, and the transparent layer TPL may be disposed in the third sub-pixel PX3.

The wavelength conversion layer WCL may include a first wavelength conversion pattern WCL1 disposed in the first sub-pixel SPX1, and a second wavelength conversion pattern WCL2 disposed in the second sub-pixel SPX2.

The first wavelength conversion pattern WCL1 may be disposed in the first light exit area LA1 in the first sub-pixel SPX1. The first wavelength conversion pattern WCL1 may be disposed on the lower reflective layer 910 in the first light exit area LA1. The first wavelength conversion pattern WCL1 may be surrounded by the first light-blocking member BK1.

The first wavelength conversion pattern WCL1 may convert light incident from the emission layer EML into light of the first color and output it. The first wavelength conversion pattern WCL1 may convert light incident from the emission layer EML into red light and output it.

The first wavelength conversion pattern WCL1 may include a first base resin BRS1, and first wavelength-converting particles WCP1 dispersed in the first base resin BRS1. The first wavelength conversion pattern WCL1 may further include first scattering particles SCP1 dispersed in the first base resin BRS1.

The second wavelength conversion pattern WCL2 may be disposed in the second light exit area LA2 in the second sub-pixel SPX2. The second wavelength conversion pattern WCL2 may be disposed on the lower reflective layer 910 in the second light exit area LA2. The second wavelength conversion pattern WCL2 may be surrounded by the first light-blocking member BK1.

The second wavelength conversion pattern WCL2 may convert light incident from the emission layer EML into light of the second color and output it. The second wavelength conversion pattern WCL2 may convert light incident from the emission layer EML into green light and output it.

The second wavelength conversion pattern WCL2 may include a second base resin BRS2 and second wavelength-converting particles WCP2 dispersed in the second base resin BRS2. The second wavelength conversion pattern WCL2 may further include second scattering particles SCP2 dispersed in the second base resin BRS2.

The transparent layer TPL may include a first transparent pattern TPL1 disposed on the third sub-pixel SPX3.

The first transparent pattern TPL1 may be disposed in the third light exit area LA3 in the third sub-pixel SPX3. The first transparent pattern TPL1 may be disposed on the lower reflective layer 910 in the third light exit area LA3. The first transparent pattern TPL1 may be surrounded by the first light-blocking member BK1.

The first transparent pattern TPL1 may output light incident from the emission layer EML without converting the wavelength of the light. The first transparent pattern TPL1 may output blue light incident from the emission layer EML without converting the wavelength of the light.

The first transparent pattern TPL1 may include a third base resin BRS3. The first transparent pattern TPL1 may further include third scattering particles SCP3 dispersed in the third base resin BRS3.

The first to third base resins BRS1, BRS2 and BRS3 may include a transparent organic material. For example, the first to third base resins BRS1, BRS2 and BRS3 may include an epoxy resin, an acrylic resin, a cardo resin, an imide resin, or the like. The first to third base resins BRS1, BRS2 and BRS3 may be made of, but is not limited to, the same material.

The first to third scattering particles SCP1, SCP2 and SCP3 may have refractive indexes different from those of the first to third base resins BRS1, BRS2 and BRS3. The first to third scattering particles SCP1, SCP2 and SCP3 may include metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the material of the organic particles may include an acrylic resin, a urethane resin, etc. The first to third scattering particles SCP1, SCP2 and SCP3 may be made of, but is not limited to, the same material.

The first wavelength-converting particles WCP1 may convert the light of the third color or the light of the second color into the light of the first color, and the second wavelength-converting particles WCP2 may convert the light of the third color into the light of the second color. For example, the first wavelength-converting particles WCP1 may be a material that converts blue light into red light, or a material that converts green light into red light. The second wavelength-converting particles WCP2 may be a material that converts blue light into green light. The first waveconverting particles WCP1 and the second wavelength-converting particles WCP2 may be quantum dots (QD), quantum bars, fluorescent material, or phosphorescent material. The quantum dots may include group IV nanocrystals, group II-VI compound nanocrystals, group III-V compound nanocrystals, group IV-VI nanocrystals, or combinations thereof.

A quantum dot may include a core and a shell overcoating the core. The core may be, but is not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge. The shell may include, but is not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, Pb Se, and PbTe.

The first capping layer CAP1 may be disposed on the wavelength conversion layer WCL, the transparent layer TPL and the first light-blocking member BK1. The first capping layer CAP1 may cover the wavelength conversion layer WCL, the transparent layer TPL, and the first light-blocking member BK1. The first capping layer CAP1 may encapsulate the wavelength conversion layer WCL, the transparent layer TPL, and the first light-blocking member BK1, thereby preventing damage to or contamination of the wavelength conversion layer WCL, the transparent layer TPL, and the first light-blocking member BK1.

The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. Although the first capping layer CAP1 is made up of a single layer in the drawings, the disclosure is not limited thereto. For example, the first capping layer CAP1 may be made up of multiple layers in which inorganic layers including at least one of the materials listed above as materials that can be included by the first capping layer CAP1 are alternately stacked on one another.

Since the wavelength control layer WLCL is disposed directly on the first planarization layer OC1, the display device 10 may not require a separate substrate for the wavelength control layer WLCL. Accordingly, the wavelength conversion layer WCL and the transparent layer TPL of the wavelength control layer WLCL can be easily aligned with the first to third light exit areas LA1, LA2, and LA3, and the thickness of the display device 10 can be relatively reduced.

The functional layer LRL may be disposed on the first capping layer CAP1. The functional layer LRL may be disposed on the wavelength control layer WLCL. The functional layer LRL increases the amount of light exiting from the wavelength control layer WLCL to the outside of the display device 10 while blocking the light incident on the inside of the display device 10 from the outside (hereinafter referred to as "outside light"), so that it can reduce the reflection of outside light in the display device 10.

The functional layer LRL may include the upper reflective layer 920 and a second light-blocking member BK2.

The upper reflective layer 920 may be disposed on the first capping layer CAP1 of the wavelength control layer WLCL. The upper reflective layer 920 may be disposed in the first to third light exit areas LA1, LA2, and LA3 and the light-blocking area BA.

The upper reflective layer 920 can increase the luminance of the display device 10 by recycling at least some of rays of light which travel toward the upper side from the wavelength conversion layer WCL or the transparent layer TPL by reflecting them toward a lower side of the upper reflective layer 920. Some of the rays of light traveling toward the upper side from the wavelength conversion layer WCL may be reflected by the upper reflective layer 920 to travel toward the lower reflective layer 910, such that they may be reflected again by the lower reflective layer 910 to re-enter the wavelength conversion layer WCL. Accordingly, the upper reflective layer 920 may direct at least some of the rays of light traveling toward the upper side from the wavelength conversion layer WCL to the lower reflective layer 910 so that they re-enter the wavelength conversion layer WCL, and thus the efficiency of converting light can be improved. As a result, the amount of the rays of light of the same color as light of the sub-pixel SPX is increased, so that the luminance of the display device 10 can be increased.

The upper reflective layer 920 may include a reflective material. The upper reflective layer 920 may be made of, for example, aluminum (Al), nickel (Ni), lanthanum (La), silver (Ag), or an alloy thereof, or a material including metal such as indium tin oxide (ITO), indium zinc oxide (IZO), and indium tin zinc oxide (ITZO). It is, however, to be understood that the disclosure is not limited thereto.

The upper reflective layer 920 may include first holes HO1 located in the light exit areas LA. The first holes HO1 may overlap the first to third light exit areas LA1, LA2, and LA3.

The second light-blocking member BK2 may be disposed on the upper reflective layer 920. The second light-blocking member BK2 may be disposed in the first to third light exit areas LA1, LA2, and LA3 and the light-blocking area BA. The second light-blocking member BK2 may overlap the upper reflective layer 920 in the thickness direction.

The second light-blocking member BK2 may absorb at least some of rays of light incident from the outside of the display device 10 to reduce the reflection of outside light. Accordingly, the second light-blocking member BK2 can prevent the display quality of the display device 10 from being deteriorated by reflection of outside light. The second light-blocking member BK2 can improve the color gamut by preventing rays of light from intruding into a space between the first to third light exit areas LA1, LA2, and LA3 and mixed with each other.

The second light-blocking member BK2 may include a light-absorbing material that absorbs light in the visible wavelength range. For example, the second light-blocking member BK2 may include an inorganic light-blocking material or an organic light-blocking material.

The second light-blocking member BK2 may include second holes HO2 located in the light exit areas LA. The second holes HO2 may overlap the first to third light exit areas LA1, LA2, and LA3. The second holes HO2 may overlap the first holes HO1 of the upper reflective layer 920 in the thickness direction.

The first holes HO1 and the second holes HO2 may overlap each other to form a second opening OP2. The second opening OP2 may be a passage through which light exits from the wavelength control layer WLCL to the outside.

The color filter layer CFL may be disposed on the functional layer LRL. The color filter layer CFL may include a first color filter CF1 and a second color filter CF2.

The first color filter CF1 may be disposed in the first light exit area LA1. The first color filter CF1 may be surrounded by the upper reflective layer 920 and the second light-blocking member BK2, and may cover (or overlap) at least part of the upper reflective layer 920 and the second light-blocking member BK2 disposed in the first light exit area LA1. The first color filter CF1 may overlap the first wavelength conversion pattern WCL1 in the thickness direction.

The first color filter CF1 can prevent the light of the third color (e.g., blue light) emitted from the emission layer EML from transmitting the first wavelength conversion pattern WCL1 and being mixed with the light of the first color (e.g., red light) converted by the first wavelength conversion pattern WCL1. For example, the first color filter CF1 may block or absorb the light of the third color (e.g., blue light) which is not converted by the first wavelength conversion pattern WCL1.

The second color filter CF2 may be disposed in the second light exit area LA2. The second color filter CF2 may be surrounded by the upper reflective layer 920 and the second light-blocking member BK2, and may cover at least part of the upper reflective layer 920 and the second light-blocking member BK2 disposed in the second light exit area LA2. The second color filter CF2 may overlap the second wavelength conversion pattern WCL2 in the thickness direction.

The second color filter CF2 can prevent that the light (e.g., blue light) emitted from the emission layer EML from transmitting the second wavelength conversion pattern WCL2 and being mixed with the light of the second color (e.g., green light) converted by the second wavelength conversion pattern WCL2. For example, the second color filter CF2 may block or absorb the light of the third color (e.g., blue light) which is not converted by the second wavelength conversion pattern WCL2.

The first color filter CF1 and the second color filter CF2 may include the same material and may be formed on the same layer. Both the first color filter CF1 and the second color filter CF2 may be formed by a single process. Accordingly, the first color filter CF1 and the second color filter CF2 may selectively transmit light of the first color (e.g., red light) and light of the second color (e.g., green light) and may block or absorb light of the third color (e.g., blue light). For example, the first color filter CF1 and the second color filter CF2 may include a yellow photosensitive film. It should be understood, however, that the disclosure is not limited thereto. The first color filter CF1 may be a red color filter that selectively transmits the light of the first color (e.g., red light) and blocks or absorbs the light of the second color (e.g., green light) and the light of the third color (e.g., the blue light). The second color filter CF2 may be a green color filter that selectively transmits the light of the second color (e.g., green light) and blocks or absorbs the light of the first color (e.g., red light) and the light of the third color (e.g., the blue light).

The color filter layer CFL may not be disposed in the third light exit area LA3. The color filter layer CFL may overlap the first and second light exit areas LA1 and LA2 but does not overlap the third light exit area LA3, and thus the light of the third light (e.g., blue light) exiting in the third light exit area LA3 through the first transparent pattern TPL1 can be output to the outside of the display device 10. Although the color filter layer CFL is not disposed in the third light exit area LA3 according to the embodiment of FIG. 2, the disclosure is not limited thereto. As will be described below, in some other embodiments, the color filter layer CFL may be further disposed in the third light exit area LA3. The color filter layer CFL may absorb at least some of rays of light introduced from the outside of the display device 10 to reduce the reflection of outside light.

A second planarization layer OC2 may be disposed on the color filter layer CFL and the functional layer LRL. The second planarization layer OC2 may provide a flat surface over the color filter layer CFL and the functional layer LRL. The second planarization layer OC2 and the first planarization layer OC1 may be made of the same material, or the second planarization layer OC2 may be made of the materials that may be used to form the first planarization layer OC1, e.g., materials listed above as the examples of the first planarization layer OC1.

An anti-reflection member 930 may be disposed on the second planarization layer OC2. The anti-reflection member 930 may absorb light incident from the outside to prevent the display quality of the display device 10 from being deteriorated by reflection of outside light. In an embodiment, the anti-reflection member 930 includes a dye that can absorb rays of light other than the rays of light of the first to third colors (e.g., red, green, and blue) to prevent reflection of outside light.

Figure 3:
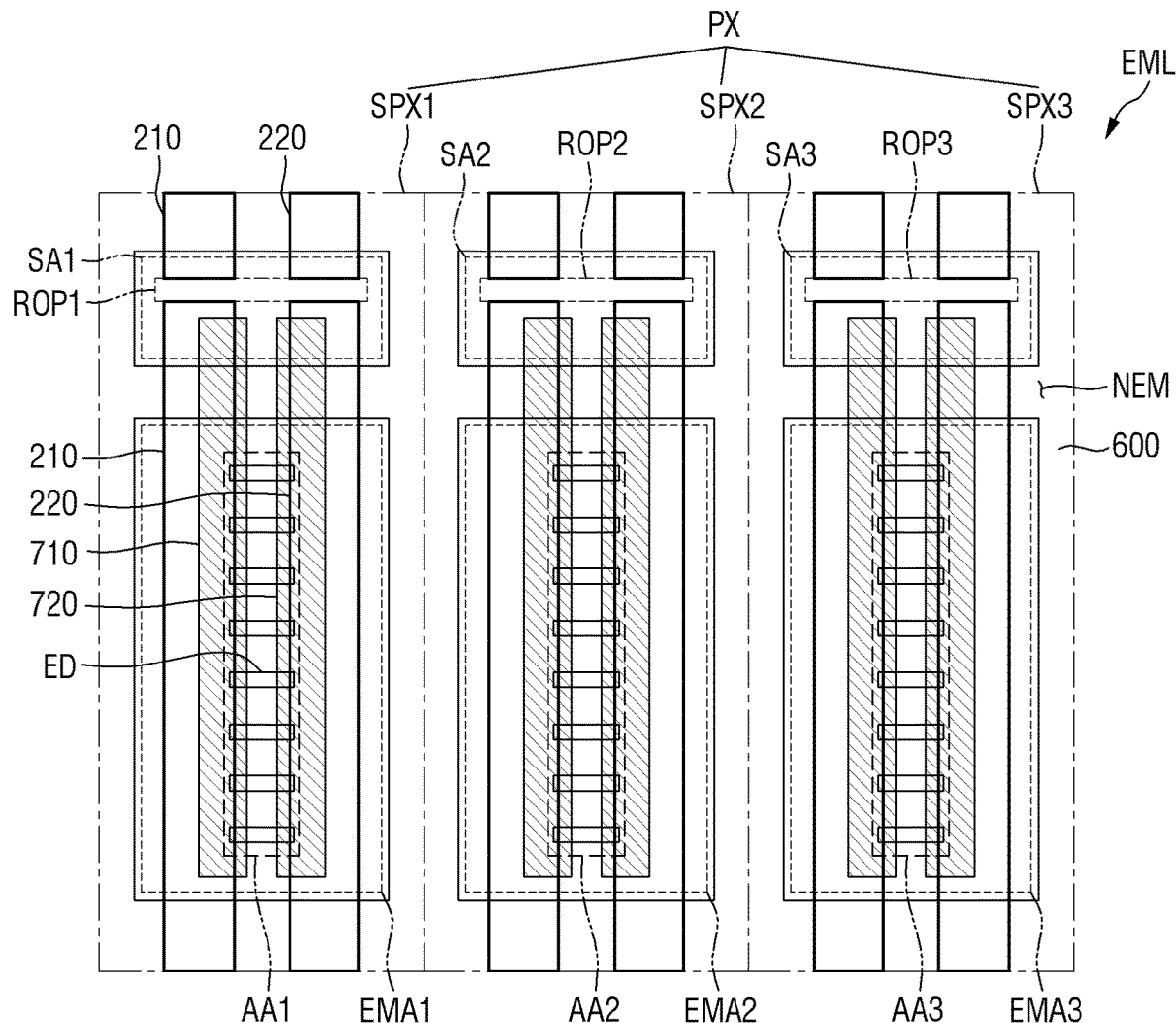
FIG. 3 is a schematic plan view illustrating a layout of an emission layer of a pixel according to an embodiment.

FIG. 3 is a schematic plan view illustrating a layout of an emission layer of a pixel according to an embodiment. FIG. 4 is a schematic plan view illustrating a layout of an emission layer of a first sub-pixel according to an embodiment.

Figure 4:
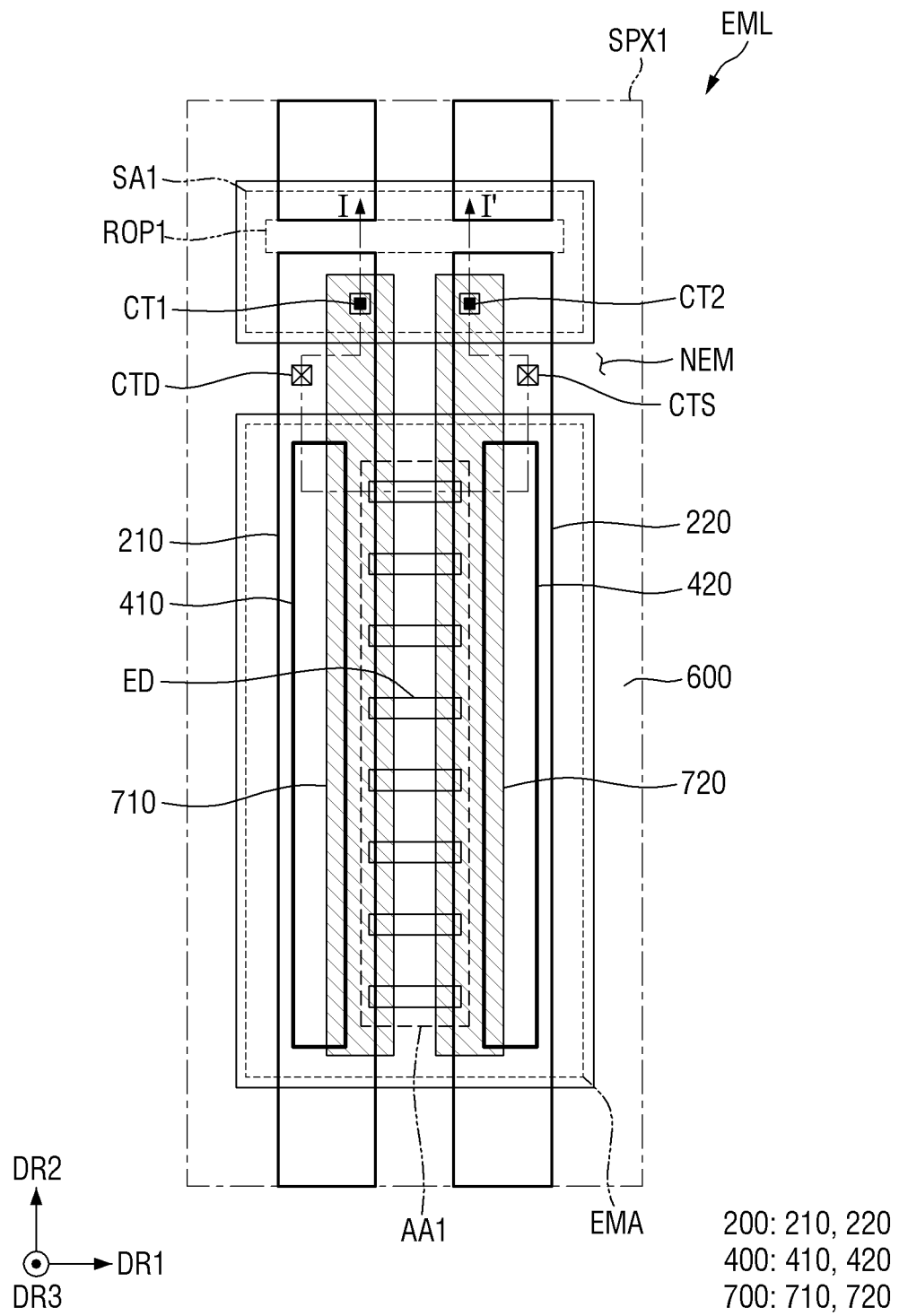
FIG. 4 is a schematic plan view illustrating a layout of an emission layer of a sub-pixel according to an embodiment of the disclosure.

Referring to FIGS. 3 and 4, each of the first to third emission area EMA1, EMA2, and EMA3 may include an area in which the light-emitting diodes ED are arranged and an area adjacent thereto. Each of the first to third emission areas EMA1, EMA2, and EMA3 may further include an area in which light emitted from the light-emitting diodes ED is reflected or refracted by other elements to be emitted.

The emission area EMA may include an alignment area AA where the light-emitting diodes ED aligned. The alignment area AA may be the area where the light-emitting elements ED is intensively aligned in the emission area EMA. The alignment area AA may be an imaginary area defined by the first bank 400 and the light-emitting diodes ED.

The alignment area AA may include a first alignment area AA1 included in the first sub-pixel SPX1, a second alignment area AA2 included in the second sub-pixel SPX2, and a third alignment area AA3 included in the third sub-pixel SPX3.

The non-emission area NEM may include a subsidiary area SA. The light-emitting diodes ED may not be disposed in the subsidiary area SA.

The subsidiary area SA may include a first subsidiary area SA1 included in the first sub-pixel SPX1, a second subsidiary area SA2 included in the second sub-pixel SPX2, and a third subsidiary area SA3 included in the third sub-pixel SPX3.

The subsidiary area SA may be disposed on the upper side of the emission area EMA (or on one side in the second direction DR2). For example, the first subsidiary area SA1 may be disposed on the upper side of the first emission area EMA1, the second subsidiary area SA2 may be disposed on the upper side of the second emission area EMA2, and the third subsidiary area SA3 may be disposed on the upper side of the third emission area EMA3. For example, the subsidiary areas SA may be disposed between the emission areas EMA of the sub-pixels SPX adjacent to each other in the second direction DR2.

The subsidiary area SA may include a separation region ROP. For example, the first subsidiary area SA1 may include a first separation region ROP1, the second subsidiary area SA2 may include a second separation region ROP2, and the third subsidiary area SA3 may include a third separation region ROP3. In the separation region ROP, a first electrode 210 and a second electrode 220 included in a sub-pixel SPX may be separated from a first electrode 210 and a second electrode 220 included in another sub-pixel SPX adjacent to the sub-pixel SPX in the second direction DR2, respectively.

Figure 5:
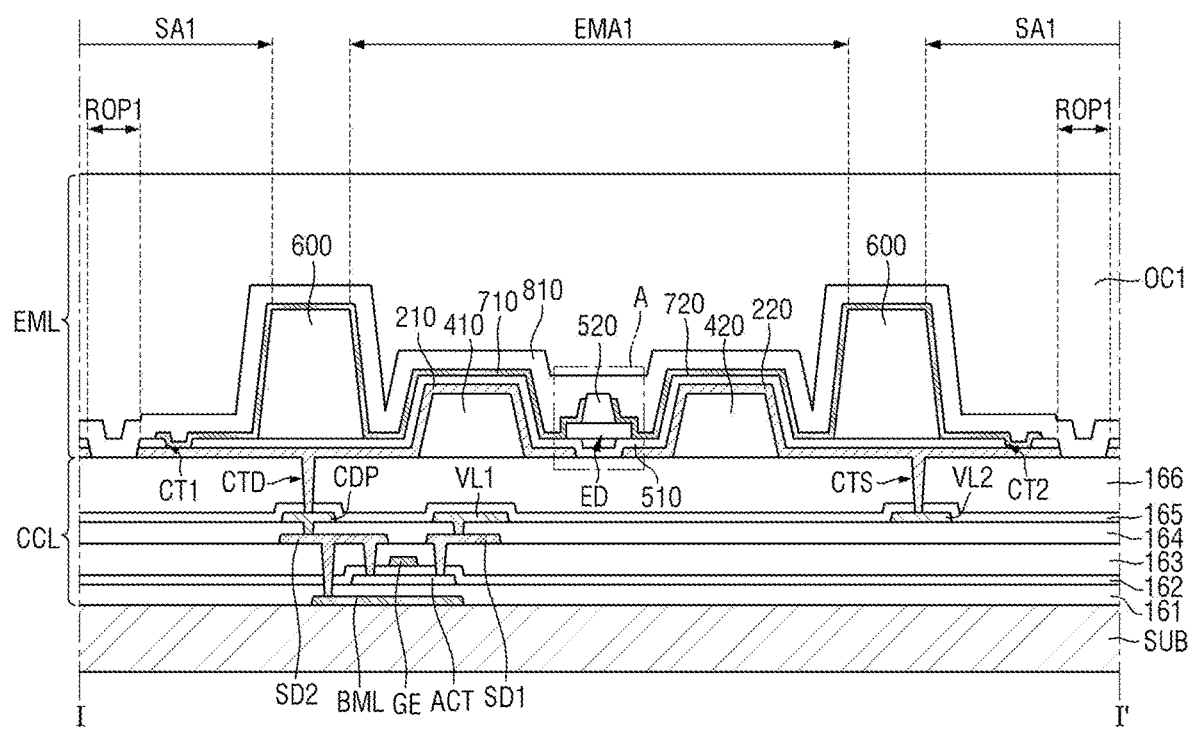
FIG. 5 is a schematic cross-sectional view illustrating an example, taken along line I-I' of FIG. 4.

FIG. 5 is a schematic cross-sectional view illustrating an example, taken along line I-I' of FIG. 4.

Referring to FIG. 5, the circuit element layer CCL may be disposed on the substrate SUB. The circuit element layer CCL may include a lower metal layer 110, a semiconductor layer 120, a first conductive layer 130, a second conductive layer 140, a third conductive layer 150, and insulating layers.

The lower metal layer 110 is disposed on the substrate SUB. The lower metal layer 110 may include a light-blocking pattern BML. The light-blocking pattern BML may be disposed at least under a channel region of an active layer ACT of a transistor TR to cover it. It is, however, to be understood that the disclosure is not limited thereto. The light-blocking pattern BML may be eliminated. The lower metal layer 110 may include a material that blocks light. For example, the lower metal layer 110 may be made of an opaque metal material that blocks light transmission.

A buffer layer 161 may be disposed over the bottom metal layer 110. The buffer layer 161 may be disposed to cover the entire surface of the substrate SUB on which the bottom metal layer 110 is disposed. The buffer layer 161 can protect transistors from moisture permeating through the substrate SUB which is vulnerable to moisture permeation.

The semiconductor layer 120 is disposed on the buffer layer 161. The semiconductor layer 120 may include the active layer ACT of the transistor TR. The active layer ACT of the transistor TR may be disposed to overlap the light-blocking pattern BML, of the lower metal layer 110 as described above.

The semiconductor layer 120 may include polycrystalline silicon, monocrystalline silicon, an oxide semiconductor, etc. In an embodiment, in case that the semiconductor layer 120 includes polycrystalline silicon, the polycrystalline silicon may be formed by crystallizing amorphous silicon. In case that the semiconductor layer 120 contains polycrystalline silicon, the active layer ACT of the transistor TR may include doped regions doped with impurities, and a channel region between them. In an embodiment, the semiconductor layer 120 may include an oxide semiconductor. For example, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), or indium gallium zinc tin oxide (IGZTO).

A gate insulator 162 may be disposed on the semiconductor layer 120. The gate insulator 162 may be made up of multiple layers in which inorganic layers including inorganic material, e.g., at least one of silicon oxide ($SiO_x$), silicon nitride ($SiN_x$), and silicon oxynitride ($SiO_xN_y$) are stacked alternately.

The first conductive layer 130 may be disposed on the gate insulator 162. The first conductive layer 130 may include the gate electrode GE of the transistor TR. The gate electrode GE may be disposed so that it overlaps the channel region of the active layer ACT1 in the thickness direction of the substrate SUB, e.g., in the third direction DR3.

A first interlayer dielectric film 163 may be disposed on the first conductive layer 130. The first interlayer dielectric film 163 may cover the gate electrode GE. The first interlayer dielectric film 163 may serve as an insulating layer between the first conductive layer 130 and other layers disposed thereon and can protect the first conductive layer 130.

The second conductive layer 140 may be disposed on the first interlayer dielectric film 163. The second conductive layer 140 may include a drain electrode SD1 of the transistor TR and a source electrode SD2 of the transistor TR.

The drain electrode SD1 and the source electrode SD2 of the transistor TR may be electrically connected to both end regions of the active layer ACT of the transistor TR through contact holes penetrating the first interlayer dielectric film 163 and the gate insulator 162, respectively. The source electrode SD2 of the transistor TR may be electrically connected to the light-blocking pattern BML, of the lower metal layer 110 through another contact hole penetrating through the first interlayer dielectric film 163, the gate insulator 162, and the buffer layer 161.

A second interlayer dielectric layer (or second interlayer dielectric film) 164 may be disposed on the second conductive layer 140. The second interlayer dielectric film 164 may be disposed to cover (or overlap) the drain electrode SD1 of the transistor TR and the source electrode SD2 of the transistor TR. The second interlayer dielectric film 164 may serve as an insulating film between the second conductive layer 140 and other layers disposed thereon and can protect the second conductive layer 140.

The third conductive layer 150 may be disposed on the second interlayer dielectric film 164. The third conductive layer 150 may include a first voltage line VL1, a second voltage line VL2, and a conductive pattern CDP.

The first voltage line VL1 may overlap at least part of the drain electrode SD1 of the transistor TR in the thickness direction of the substrate SUB. A high-level voltage (or first supply voltage) supplied to the transistor TR may be applied to the first voltage line VL1.

The second voltage line VL2 may be electrically connected to the second electrode 220 through a second electrode contact hole CTS penetrating through a via layer 166 and a passivation layer 165 to be described below. A low-level voltage (or second supply voltage), which is lower than the high-level voltage supplied to the first voltage line VL1, may be applied to the second voltage line VL2. The high-level voltage (or first supply voltage) to be supplied to the transistor TR may be applied to the first voltage line VL1, and the low-level voltage (or second supply voltage), which is lower than the high-level voltage supplied to the first voltage line VL1, may be applied to the second voltage line VL2.

The conductive pattern CDP may be electrically connected to the source electrode SD2 of the transistor TR. The conductive pattern CDP may be electrically connected to the source electrode SD2 of the transistor TR through a contact hole penetrating the second interlayer dielectric film 164. The conductive pattern CDP may be electrically connected to the first electrode 210 through a first electrode contact hole CTD penetrating the via layer 166 and the passivation layer 165 to be described below.

The passivation layer 165 may be disposed on the third conductive layer 150. The passivation layer 165 may be disposed to cover (or overlap) the third conductive layer 150. The passivation layer 165 may serve to protect the third conductive layer 150.

Each of the buffer layer 161, the first gate insulator 162, the first interlayer dielectric film 163, the second interlayer dielectric film 164, and the passivation layer 165 may be made up of multiple inorganic layers stacked alternately. For example, the buffer layer 161, the first gate insulator 162, the first interlayer dielectric film 163, the second interlayer dielectric film 164, and the passivation layer 165 may be made up of a double layer in which inorganic layers including at least one of silicon oxide ($SiO_x$), silicon nitride ($SiN_x$), and silicon oxynitride (SiON) are stacked, or may be made up of multiple layers in which they are alternately stacked. It is, however, to be understood that the disclosure is not limited thereto. The buffer layer 161, the gate insulator 162, the first interlayer dielectric film 163, the second interlayer dielectric film 164, and the passivation layer 165 may be made up of a single inorganic layer including the above-described insulating material.

The via layer 166 may be disposed on the passivation layer 165. The via layer 166 may have a generally flat surface regardless of the shape or presence of patterns disposed thereunder. In other words, the via layer 166 may provide a flat surface over the passivation layer 165. The via layer 166 may include an organic insulating material, for example, an organic material such as polyimide (PI). Hereinafter, a structure of the emission layer EML disposed on the circuit device layer (or circuit element layer) CCL of the first sub-pixel SPX1 will be described with reference to FIGS. 3 to 5. The structure of the emission layer EML disposed in the first sub-pixel SPX1 may be equally applied to the second sub-pixel SPX2 and the third sub-pixel SPX3. Therefore, the structure of the emission layer EML disposed in the second sub-pixel SPX2 and the third sub-pixel SPX3 will not be described to avoid repetitive descriptions.

The first bank 400 may be disposed on the via layer 166. The first bank 400 may be disposed directly on the upper surface of the via layer 166. The first bank 400 may be disposed in the first emission area EMA1.

The first bank 400 may be disposed in the first emission area EMA1. The first bank 400 may include sub-banks spaced apart from each other. According to an embodiment of the disclosure, the first bank 400 may include the first sub-bank 410 and the second sub-bank 420.

Each of the first sub-bank 410 and the second sub-bank 420 may extend in the second direction DR2. The length of the first sub-bank 410 and the second sub-bank 420 in the second direction DR2 may be smaller than the length of the first emission area EMA1 surrounded by the second bank 600 in the second direction DR2.

The first sub-bank 410 may be disposed on the left side in the first emission area EMA1 in a plan view. The second sub-bank 420 may be spaced apart from the first sub-bank 410 in the first direction DR1 to be disposed on the right side in the first emission area EMA1, in a plan view. The light-emitting diodes ED may be disposed between the first sub-bank 410 and the second sub-bank 420 spaced apart from each other.

The first and second sub-banks 410 and 420 may assist the electrode layer 200 in guiding the light-emitting diodes ED so that they are aligned in the first alignment area AA1 during the process of aligning the light-emitting diodes ED among the processes of fabricating the display device 10. The light-emitting diodes ED may be disposed in the area between the first sub-bank 410 and the second sub-bank 420 spaced apart from each other.

As the first bank 400 includes the inclined side surfaces, the light that is emitted from the light-emitting diodes ED and travels toward the side surfaces of the first bank 400 can be directed toward the upper side. For example, the first bank 400 may provide the space where the light-emitting diodes ED are disposed, and may also work as reflective partition walls that change the traveling direction of light emitted from the light-emitting diodes ED toward the upper side.

Although the side surfaces of the first bank 400 have an inclined linear shape in the drawings, the disclosure is not limited thereto. For example, the side surfaces (or outer surfaces) of the first bank 400 may have a shape of a curved semi-circle or semi-ellipse. In an embodiment, the first bank 400 may include, but is not limited to, an organic insulating material such as polyimide (PI).

The electrode layer 200 may be disposed on the first bank 400 and the via layer 166 exposed by the first bank 400. The electrode layer 200 may extend in a direction and may be disposed in each of the sub-pixels SPX.

The electrode layer 200 may include electrodes spaced apart from each other. The electrode layer 200 may include a first electrode 210 and a second electrode 220 spaced apart from each other.

Each of the first electrode 210 and the second electrode 220 may extend in the second direction DR2. The first electrode 210 and the second electrode 220 may be disposed across the first emission area EMA1 and the first subsidiary area SA1 of the first sub-pixel SPX1. Each of the first electrode 210 and the second electrode 220 may be disposed on the first bank 400 and the via layer 166 exposed by the first bank 400 in the first emission area EMA1, and may be disposed on the via layer 166 in the non-emission area NEM.

The first electrode 210 may be disposed on the first sub-bank 410 in the first emission area EMA1, and the second electrode 220 may be disposed on the second sub-bank 420 in the first emission area EMA1. The first electrode 210 and the second electrode 220 may be disposed on at least inclined side surfaces of the first sub-bank 410 and the second sub-bank 420, respectively. The first and second electrodes 210 and 220 may be disposed to cover at least the side surfaces of the first and second sub-banks 410 and 420 facing each other, respectively, to reflect light emitted from the light-emitting diodes ED.

The first electrode 210 may be electrically connected to the conductive pattern CDP through a first electrode contact hole CTD penetrating the via layer 166. The first electrode 210 may contact the upper surface of the conductive pattern CDP exposed by the first electrode contact hole CTD. The first electrode 210 may be electrically connected to the transistor TR through the conductive pattern CDP. Although the first electrode contact hole CTD is disposed to overlap the second bank 600 in the third direction DR3 in the example shown in the drawings, the position of the first electrode contact hole CTD is not limited thereto.

The second electrode 220 may be electrically connected to the second voltage line VL2 through a second electrode contact hole CTS penetrating the via layer 166. The second electrode 220 may contact the upper surface of the second voltage line VL2 exposed by the second electrode contact hole CTS. The second supply voltage may be applied to the second electrode 220 through the second voltage line VL2. Although the second electrode contact hole CTS is disposed to overlap the second bank 600 in the third direction DR3 in the example shown in the drawings, the position of the second electrode contact hole CTS is not limited thereto.

The first electrode 210 and the second electrode 220 disposed in the first sub-pixel PX1 may be extended in the second direction DR2 in a plan view, and may be separated from the first electrode 210 and the second electrode 220 of another first sub-pixel SPX1 adjacent to the first sub-pixel PX1 in the second direction DR2 in the first separation region ROP1 of the first subsidiary area SA1, respectively. The first electrode 210 and the second electrode 220 separated in the first separation region ROP1 may be formed after aligning the light-emitting diodes ED during the process of fabricating the display device 10. In the process of aligning the light-emitting diodes ED among the processes of fabricating the display device 10, an electric field may be generated using alignment lines extended in the second direction DR2, and the light-emitting diodes ED may be aligned by receiving a dielectrophoretic force by the electric field generated over the alignment lines. After the process of aligning the light-emitting diodes ED has been carried out, the alignment lines are separated from each other in the first separation region ROP1 of the first subsidiary area SA1, and the first electrode 210 and the second electrode 220 as shown in FIGS. 3 and 4 may be formed.

The first electrode 210 and the second electrode 220 may be electrically connected to the light-emitting diodes ED. The first electrode 210 and the second electrode 220 may be electrically connected to both ends of the light-emitting diodes ED through first contact electrode 710 and the second contact electrode 720, respectively, and may transmit electric signals applied from the circuit element layer CCL to the light-emitting diodes ED.

The electrode layer 200 may include a conductive material having a high reflectance. For example, the electrode layer 200 may include a metal such as silver (Ag), copper (Cu), aluminum (Al), molybdenum (Mo), and titanium (Ti) as the material having a high reflectance, and may be an alloy including aluminum (Al), nickel (Ni), lanthanum (La), etc. The electrode layer 200 may reflect light that is emitted from the light-emitting diodes ED and travels toward the side surfaces of the first bank 400 toward the upper side of the first sub-pixels SPX1. It is, however, to be understood that the disclosure is not limited thereto. The electrode layer 200 may further include a transparent conductive material. For example, the electrode layer 200 may include a material such as ITO, IZO, and ITZO. In some embodiments, the electrode layer 200 may have a structure in which at least one layer of a transparent conductive material and at least one layer of a metal having high reflectance are stacked, or may be made up of a single layer including them. For example, the electrode layer 200 may have a stack structure such as ITO/Ag/ITO/, ITO/Ag/IZO, or ITO/Ag/ITZO/IZO.

The first insulating layer 510 may be disposed on the electrode layer 200. The first insulating layer 510 may be disposed to cover the electrode layer 200 and the via layer 166 exposed by the electrode layer 200.

The first insulating layer 510 may include first and second contacts CT1 and CT2 exposing at least part of the first electrode 210 and the second electrode 220, respectively. The contact electrodes 700 and the electrode layer 200 may be electrically connected to each other through the first contact CT1 exposing at least part of the first electrode 210, and the second contact CT2 exposing at least part of the second electrode 220. Although the first and second contacts CT1 and CT2 exposing a part of the electrode layer 200 are disposed in the first subsidiary area SA1 in the example shown in the drawings, the disclosure is not limited thereto. For example, the first and second contacts CT1 and CT2 exposing a part of the electrode layer 200 may be located in the first emission area EMA1.

The second bank 600 may be disposed on the first insulating layer 510. The second bank 600 may be disposed in a lattice pattern, including portions extended in the first direction DR1 and the second direction DR2 in a plan view.

The second bank 600 may be disposed across the boundary between the sub-pixels SPX to distinguish between adjacent sub-pixels PX from each other, and may distinguish the emission area EMA from the subsidiary area SA. The second bank 600 has a height greater than that of the first bank 400 to distinguish between the areas. Accordingly, during an inkjet printing process for aligning the light-emitting diodes ED of the process of fabricating the display device 10, it is possible to prevent the ink in which the light-emitting diodes ED is dispersed from being mixed into the adjacent sub-pixel SPX, and thus the ink can be ejected into the emission areas EMA.

The second bank 600 may include an organic insulating material, for example, polyimide (PI), but the disclosure is not limited thereto.

The light-emitting diodes ED may be disposed on the first insulating layer 510 in the first emission area EMA1. The light-emitting diodes ED may be disposed between the first and second sub-banks 410 and 420. The light-emitting diodes ED may be disposed on the first insulating layer 510 so that both ends of the light-emitting diodes ED are positioned on the first electrode 210 and the second electrode 220, respectively, between the first sub-bank 410 and the second sub-bank 420.

The light-emitting diodes ED may be disposed in the first emission area EMA1. The light-emitting diodes ED may be disposed between the first electrode 210 and the second electrode 220 disposed on the first bank 400 in the first emission area EMA1. The light-emitting diodes ED may be disposed in the area between the first electrode 210 disposed on the first sub-bank 410 and the second electrode 220 disposed on the second sub-bank 420 spaced apart from each other.

The light-emitting diodes ED may extend in a direction, and the direction in which the light-emitting diodes ED are extended may be substantially perpendicular to the direction in which the first electrode 210 and the second electrode 220 are extended. It is, however, to be understood that the disclosure is not limited thereto. The light-emitting diodes ED may be oriented obliquely with respect to the direction in which the first electrode 210 and the second electrode 220 are extended.

The light-emitting diodes ED may be disposed such that at least one of both ends of the light-emitting diodes ED is placed on the first electrode 210 or the second electrode 220 between the first sub-bank 410 and the second sub-bank 420 spaced apart from each other. For example, the light-emitting diodes ED may be disposed such that both ends of the light-emitting diodes ED are placed on the first electrode 210 and the second electrode 220, respectively, between the first sub-bank 410 and the second sub-bank 420 spaced apart from each other. The relative arrangement relationship between the light-emitting diodes ED, the first bank 400, and the electrode layer 200 in a plan view may be created with an electric field generated between the first electrode 210 and the second electrode 220 by applying alignment signals to the first electrode 210 and the second electrode 220 to align the light-emitting diodes ED during the process of fabricating the display device 10

As described above, in the first alignment area AA1 located in the first emission area EMA1, the light-emitting diodes ED may be intensively aligned during the process of aligning the light-emitting diodes ED among the processes of fabricating the display device 10. The process of aligning the light-emitting diodes ED may be carried out by spraying an ink in which the light-emitting diodes ED are dispersed into the emission area EMA partitioned by the second bank 600 and applying alignment signals to the first electrode 210 and the second electrode 220 to generate the electric field between the first electrode 210 and the second electrode 220. In the first emission area EMA1, the light-emitting diodes ED may be aligned between the first sub-bank 410 and the second sub-bank 420 so that both ends thereof are placed on the first electrode 210 and the second electrode 220, respectively, by the electric field generated between the first electrode 210 and the second electrode 220. Accordingly, the first alignment area AA1 may be defined as the area between the first sub-bank 410 and the second sub-bank 420 spaced apart from each other, on which the first electrode 210 and the second electrode 220 are disposed, respectively. The light-emitting diodes ED may be generally aligned so that they are disposed in the first alignment area AA1 during the process of fabricating the display device 10.

As the first alignment area AA1 is defined as the area between the sub-banks 410 and 420 in the first emission area EMA1, the shape of the first alignment area AA1 may be substantially identical to the shape of the area between the sub-banks 410 and 420 spaced apart from each other in a plan view. In an embodiment where each of the first and second sub-banks 410 and 420 extends in the second direction DR2 and is spaced apart from each other in the first direction DR1, the shape of an area between the second sub-banks 410 and 420 spaced apart from each other may also be extended in the second direction DR2 in a plan view. Accordingly, the shape of the first alignment area AA1 may extend in the second direction DR2 in a plan view. For example, the first alignment area AA1 may extend in the second direction DR2 in the first emission area EMA1 in a plan view.

Accordingly, the light-emitting diodes ED may be disposed in the first alignment area AA1 such that they are spaced apart from each other in the second direction DR2. The light-emitting diodes ED may be aligned in a single column in the entire first alignment area AA1, and the distance between the light-emitting diodes ED disposed adjacent to each other in the second direction DR2 may be random.

A second insulating layer 520 may be disposed on the light-emitting diodes ED. The second insulating layer 520 may be disposed to partially surround the outer surface of the light-emitting diodes ED so that both ends of the light-emitting diodes ED are not covered. Accordingly, the width of the second insulating layer 520 in the first direction DR1 may be smaller than the length of the light-emitting diodes ED in the first direction DR1 in which the light-emitting diodes ED are extended. A part of the second insulating layer 520 which is disposed on the light-emitting diode ED may be extended in the second direction DR2 on the first insulating layer 510 in a plan view, thereby forming a linear or island-like pattern in each of the first sub-pixel SPX1. The second insulating layer 520 can protect the light-emitting diode ED and fix the light-emitting diode ED during the process of fabricating the display device 10.

The contact electrodes 700 may be disposed on the second insulating layer 520. The contact electrodes 700 may include contact electrodes spaced apart from each other. For example, the contact electrodes 700 may include a first contact electrode 710 and a second contact electrode 720 spaced apart from each other.

The first contact electrode 710 may be disposed on the first electrode 210 and the second insulating layer 520. The first contact electrode 710 may be disposed to expose the upper surface of the second insulating layer 520.

The first contact electrode 710 may extend in the second direction DR2. The first contact electrode 710 may contact the first electrode 210 and the first ends of the light-emitting diodes ED. The first contact electrode 710 may contact the first ends of the light-emitting diodes ED exposed by the second insulating layer 520 in the first emission area EMA1. The first contact electrode 710 may contact the first electrode 210 exposed by the first contact CT1 penetrating the first insulating layer 510 in the first subsidiary area SA1. As the first contact electrode 710 contacts first ends of the light-emitting diodes ED and the first electrode 210, the first contact electrode 710 can electrically connect the first ends of the light-emitting diodes ED with the first electrode 210.

The second contact electrode 720 may be disposed on the second electrode 220 and the second insulating layer 520. The second contact electrode 720 may be disposed to expose the upper surface of the second insulating layer 520. The second contact electrode 720 may be spaced apart from the first contact electrode 710, with the second insulating layer 520 therebetween.

The second contact electrode 720 may extend in the second direction DR2. The second contact electrode 720 may contact the second electrode 220 and the second ends of the light-emitting diodes ED. The second contact electrode 720 may contact the second ends of the light-emitting diodes ED exposed by the second insulating layer 520 in the first emission area EMA1. The second contact electrode 720 may contact the second electrode 220 exposed by the second contact CT2 penetrating the first insulating layer 510 in the first subsidiary area SA1. As the second contact electrode 720 contacts second ends of the light-emitting diodes ED and the second electrode 220, the second contact electrode 720 can electrically connect the second ends of the light-emitting diodes ED with the second electrode 220.

The contact electrodes 700 may include a conductive material. For example, the contact electrodes 700 may include ITO, IZO, ITZO, aluminum (Al), etc. For example, the contact electrodes 700 may include a transparent conductive material. The light emitted from the light-emitting diodes ED may transmit the contact electrodes 700 to proceed toward the first electrode 210 and the second electrode 220, and may be reflected by the outer surfaces of the first electrode 210 and the second electrode 220.

The protective layer 810 may be disposed on the contact electrodes 700. The protective layer 810 may cover the entire surface of the substrate SUB, so that it can protect the first bank 400, the electrode layer 200, the light-emitting diodes ED, the contact electrodes 700, and the second bank 600 disposed under the protective layer 810.

The first planarization layer OC1 may be disposed on the protective layer 810. The first planarization layer OC1 may provide a flat surface over the protective layer 810.

Figure 6:
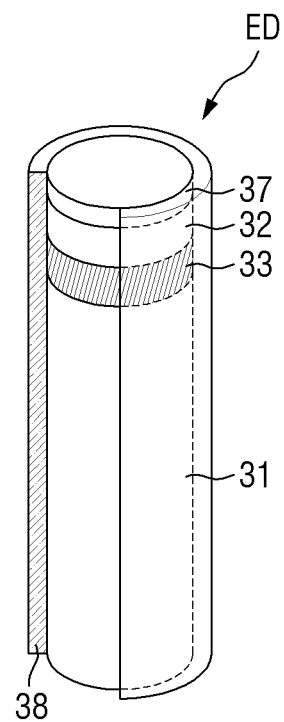
FIG. 6 is a schematic perspective view of a light-emitting element according to an embodiment of the disclosure.

FIG. 6 is a schematic perspective view of a light-emitting element according to an embodiment of the disclosure.

Referring to FIG. 6, the light-emitting diode ED is a particle-type element and may have a rod-like or cylindrical shape having a predetermined aspect ratio. The length of the light-emitting diode ED may be larger than the diameter of the light-emitting diode ED, and the aspect ratio may range from, but is not limited to, about 6:5 to about 100:1.

The light-emitting diodes ED may have a size of a nanometer scale (from about 1 nm to about 1 μm) to a micrometer scale (from about 1 μm to about 1 mm). In an embodiment, both of the diameter and length of the light-emitting element ED may have sizes of the nanometer scales or micrometer scales. In some embodiments, the diameter of the light-emitting element ED may have a size of the nanometer scale, while the length of the light-emitting element ED may have a size of the micrometer scale. In some embodiments, the diameter and/or length of some of the light-emitting elements ED may have a size of the nanometer scales, while the diameter and/or length of some others of the light-emitting diodes ED have a size of the micrometer scales.

In an embodiment, the light-emitting element ED may be an inorganic light-emitting diode. The inorganic light-emitting diode may include semiconductor layers. For example, the inorganic light-emitting diode may include a first conductivity type (e.g., n-type) semiconductor layer, a second conductivity type (e.g., p-type) semiconductor layer, and an active semiconductor layer interposed therebetween. The active semiconductor layer may receive holes and electrons from the first conductivity type semiconductor layer and the second conductivity type semiconductor layer, respectively, and the holes and electrons reaching the active semiconductor layer may be combined to emit light.

In an embodiment, the above-described semiconductor layers may be sequentially stacked in a direction, which is the longitudinal direction of the light-emitting diode ED. The light-emitting diode ED may include a first semiconductor layer 31, an active layer 33, and a second semiconductor layer 32 sequentially stacked in a direction. The first semiconductor layer 31, the active layer 33, and the second semiconductor layer 32 may be the first conductivity type semiconductor layer, the active semiconductor layer, and the second conductivity type semiconductor layer described above, respectively.

The first semiconductor layer 31 may be doped with a first conductivity type dopant. The first conductivity type dopant may be Si, Ge, Sn, etc. In an embodiment, the first semiconductor layer 31 may be n-GaN doped with n-type Si.

The second semiconductor layer 32 may be spaced apart from the first semiconductor layers 31 with the active layer 33 therebetween. The second semiconductor layer 32 may be doped with a second conductivity type dopant such as Mg, Zn, Ca, Se and Ba. In an embodiment, the second semiconductor layer 32 may be p-GaN doped with p-type Mg.

The active layer 33 may include a material having a single or multiple quantum well structure. As described above, the active layer 33 may emit light as electron-hole pairs are combined therein in response to an electrical signal applied thereto through the first semiconductor layer 31 and the second semiconductor layer 32.

In some embodiments, the active layer 33 may have a structure in which a semiconductor material having a large band gap energy and a semiconductor material having a small band gap energy are alternately stacked, and may include other Group III to Group V semiconductor materials depending on the wavelength range of emitted light.

The light emitted from the active layer 33 may exit not only through the both end surfaces of the light-emitting diode ED in the longitudinal direction but also through the outer peripheral surface (or outer surface or side surface) of the light-emitting diode ED. For example, the directions in which the light emitted from the active layer 33 propagates or travels are not limited to one direction.

The light-emitting diode ED may further include an element electrode layer 37 disposed on the second semiconductor layer 32. The element electrode layer 37 may contact the second semiconductor layer 32. The element electrode layer 37 may be an ohmic contact electrode, but is not limited thereto. It may be a Schottky contact electrode.

In case that both ends of the light-emitting diode ED are electrically connected to the contact electrodes 700 to apply electric signals to the first and second semiconductor layers 31 and 32, the element electrode layer 37 may be disposed between the second semiconductor layer 32 and the electrode to reduce the resistance. The element electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). The element electrode layer 37 may include a semiconductor material doped with n-type or p-type impurities.

The light-emitting diode ED may further include an insulating film 38 surrounding the outer peripheral surfaces of the first semiconductor layer 31, the second semiconductor layer 32, the active layer 33, and/or the element electrode layer 37. The insulating film 38 may be disposed to surround at least the outer surface of the active layer 33, and may be extended in a direction in which the light-emitting element ED is extended. The insulating film 38 can protect the above-described elements. The insulating film 38 may be made of materials having insulating properties and can prevent an electrical short circuit that may occur in case that the active layer 33 contacts an electrode through which an electric signal is transmitted to the light-emitting diode ED. Since the insulating film 38 includes the active layer 33 to protect the outer peripheral surfaces of the first and second semiconductor layers 31 and 32, it is possible to prevent a decrease in luminous efficiency.

Figure 7:
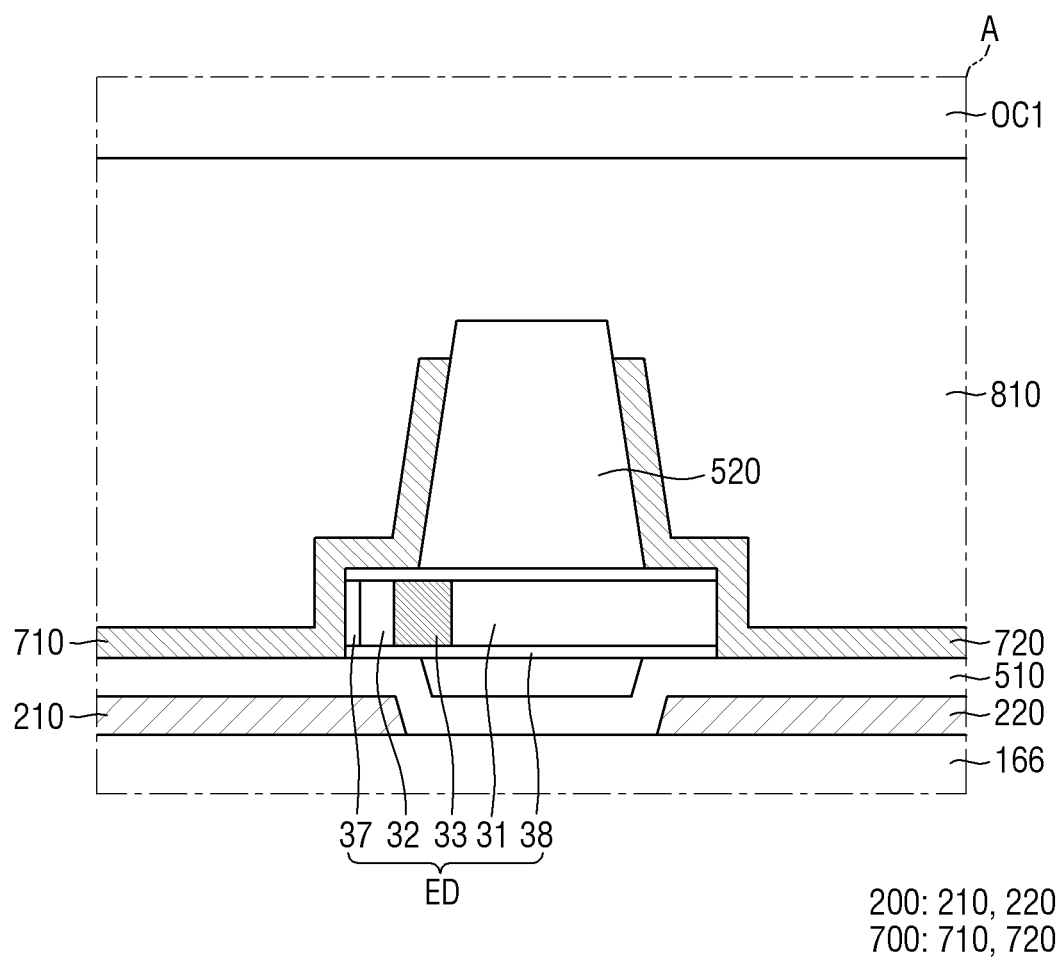
FIG. 7 is a schematic enlarged cross-sectional view illustrating an example of area A of FIG. 5.

FIG. 7 is a schematic enlarged cross-sectional view illustrating an example of area A of FIG. 5.

Referring to FIGS. 6 and 7, the light-emitting diode ED may be disposed such that the direction in which it is extended is parallel to a surface of the substrate SUB. The semiconductor layers included in the light-emitting diode ED may be arranged sequentially in the direction parallel to the upper surface of the substrate SUB. For example, the first semiconductor layer 31, the active layer 33, and the second semiconductor layer 32 of the light-emitting diode ED may be arranged sequentially parallel to the upper surface of the substrate SUB.

The first semiconductor layer 31, the active layer 33, the second semiconductor layer 32, and the element electrode layer 37 of the light-emitting diode ED may be sequentially formed parallel to the upper surface of the substrate SUB in a cross-sectional view across both ends of the light-emitting diode ED.

A first end of the light-emitting diode ED may be located on the first electrode 210, while a second end thereof may be located on the second electrode 220. It is, however, to be understood that the disclosure is not limited thereto. The first end of the light-emitting diode ED may be located on the second electrode 220, while the second end thereof may be located on the first electrode 210.

The second insulating layer 520 may be disposed on the light-emitting diodes ED. The second insulating layer 520 may be disposed to surround the outer surface of the light-emitting diode ED. The second insulating layer 520 may be disposed to surround the outer surface of the light-emitting diode ED where the light-emitting diode ED is disposed, and may be disposed on the first insulating layer 510 exposed by the light-emitting diode ED where the light-emitting diode ED is not disposed.

The first contact electrode 710 may contact a first end of the light-emitting diode ED exposed by the second insulating layer 520. The first contact electrode 710 may be disposed to surround a first end surface of the light-emitting diode ED exposed by the second insulating layer 520. The first contact electrode 710 may contact the insulating film 38 and the element electrode layer 37 of the light-emitting diode ED.

The second contact electrode 720 may contact a second end of the light-emitting diode ED exposed by the second insulating layer 520. The second contact electrode 720 may be disposed to surround a second end surface of the light-emitting diode ED exposed by the second insulating layer 520. The second contact electrode 720 may contact the insulating film 38 and the first semiconductor layer 31 of the light-emitting diode ED.

The first contact electrode 710 and the second contact electrode 720 may be spaced apart from each other with the second insulating layer 520 therebetween. The first contact electrode 710 and the second contact electrode 720 may expose at least part of the upper surface of the second insulating layer 520.

The first contact electrode 710 and the second contact electrode 720 may be formed on the same layer and may include the same material. For example, the first contact electrode 710 and the second contact electrode 720 may be formed together by a single mask process. Therefore, no additional mask process is required to form the first and second contact electrodes 710 and 720, and thus the efficiency of the process of fabricating the display device 10 can be improved.

Figure 8:
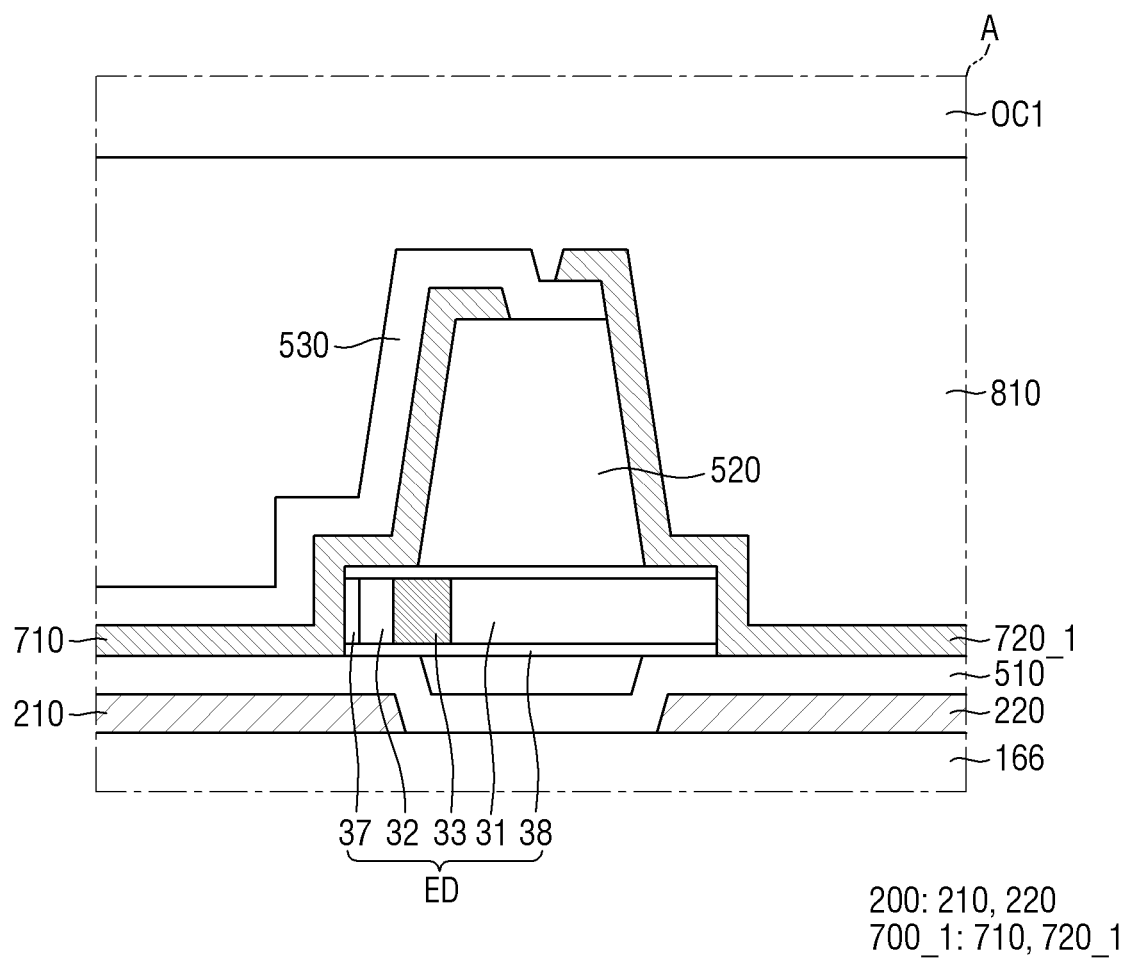
FIG. 8 is a schematic enlarged cross-sectional view illustrating another example of area A of FIG. 5.

FIG. 8 is a schematic enlarged cross-sectional view illustrating another example of area A of FIG. 5.

The embodiment of FIG. 8 is different from the embodiment of FIG. 7 in that a first contact electrode 710 and a second contact electrode 720_1 are formed on different layers in a display device 10, and the display device 10 further includes a third insulating layer 530 disposed on the first contact electrode 710.

A contact electrodes 700_1 may include the first contact electrode 710 and the second contact electrode 720_1 disposed on different layers.

The first contact electrode 710 may be disposed on the first electrode 210 and the first end of the light-emitting diode ED. The first contact electrode 710 may be extended from the first end of the light-emitting diode ED toward the second insulating layer 520 and may be disposed on a sidewall of the second insulating layer 520 and the upper surface of the second insulating layer 520. The first contact electrode 710 may be disposed on the upper surface of the second insulating layer 520, and may expose at least part of the upper surface of the second insulating layer 520.

The third insulating layer 530 may be disposed on the first contact electrode 710. The third insulating layer 530 may be disposed to completely cover the first contact electrode 710. The third insulating layer 530 may be disposed to completely cover (or overlap) a sidewall and the upper surface of the second insulating layer 520, but may not be disposed on another sidewall of the second insulating layer 520. An end of the third insulating layer 530 may be aligned with the other sidewall of the second insulating layer 520.

The second contact electrode 720_1 may be disposed on the second electrode 220 and the second end of the light-emitting diode ED. The second contact electrode 720_1 may be extended from the second end of the light-emitting diode ED toward the second insulating layer 520 and may be disposed on another sidewall of the second insulating layer 520 and the upper surface of the third insulating layer 530.

According to this embodiment, as the first contact electrode 710 and the second contact electrode 720_1 are formed as different layers and the third insulating layer 530 is interposed therebetween, an additional process is added and thus the efficiency of the process of fabricating the display device 10 may be lowered. However, the reliability of the display device 10 can be improved. As the first contact electrode 710 and the second contact electrode 720_1 are formed as different layers and the third insulating layer 530 is interposed therebetween, it is possible to suppress or minimize the issue of a short circuit between the first contact electrode 710 and the second contact electrode 720_1 during the process of fabricating the display device 10.

Figure 9:
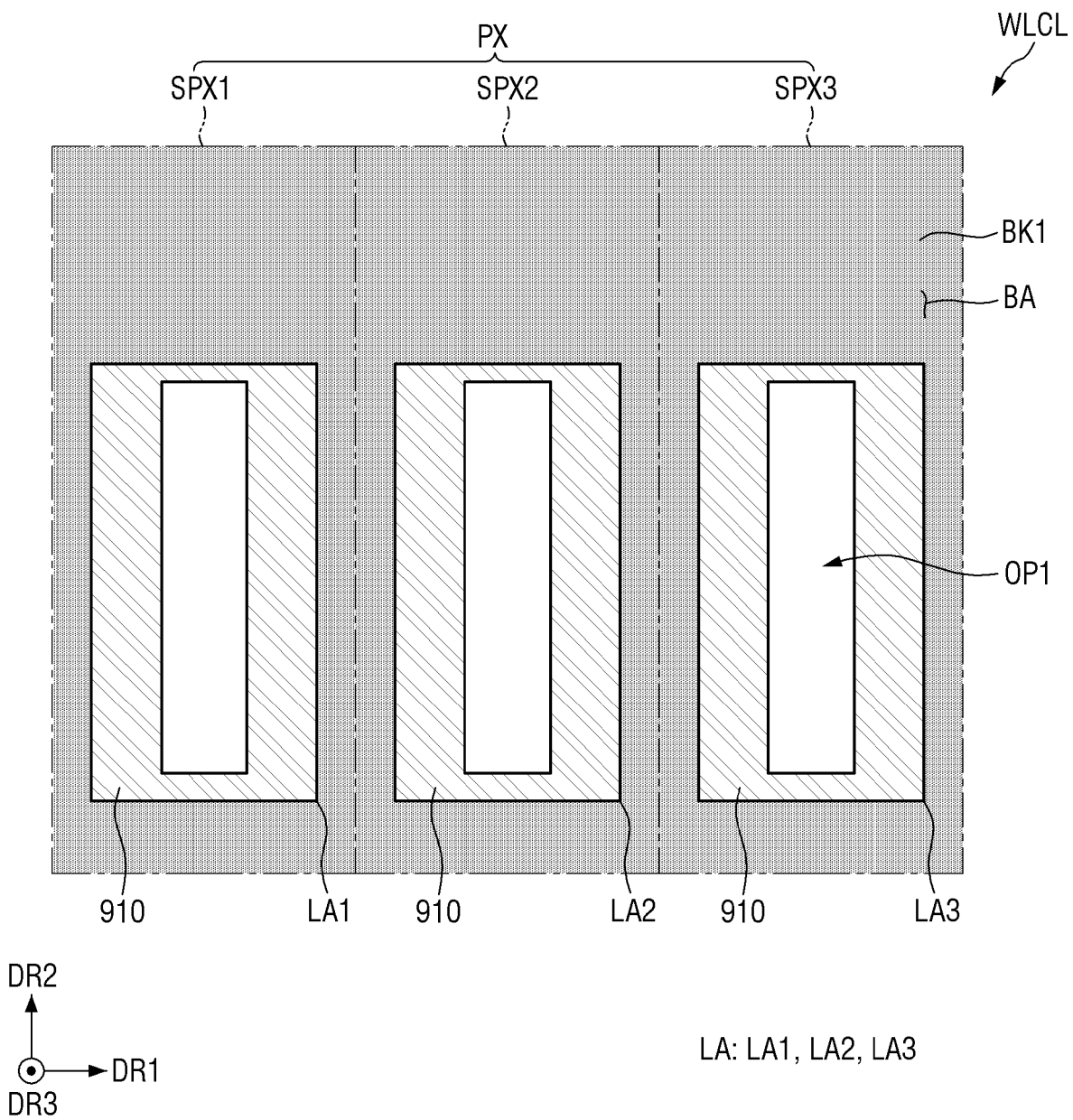
FIG. 9 is a schematic plan view illustrating a relative arrangement of a lower reflective layer and a first light-blocking member of a wavelength control layer according to an embodiment.
Figure 10:
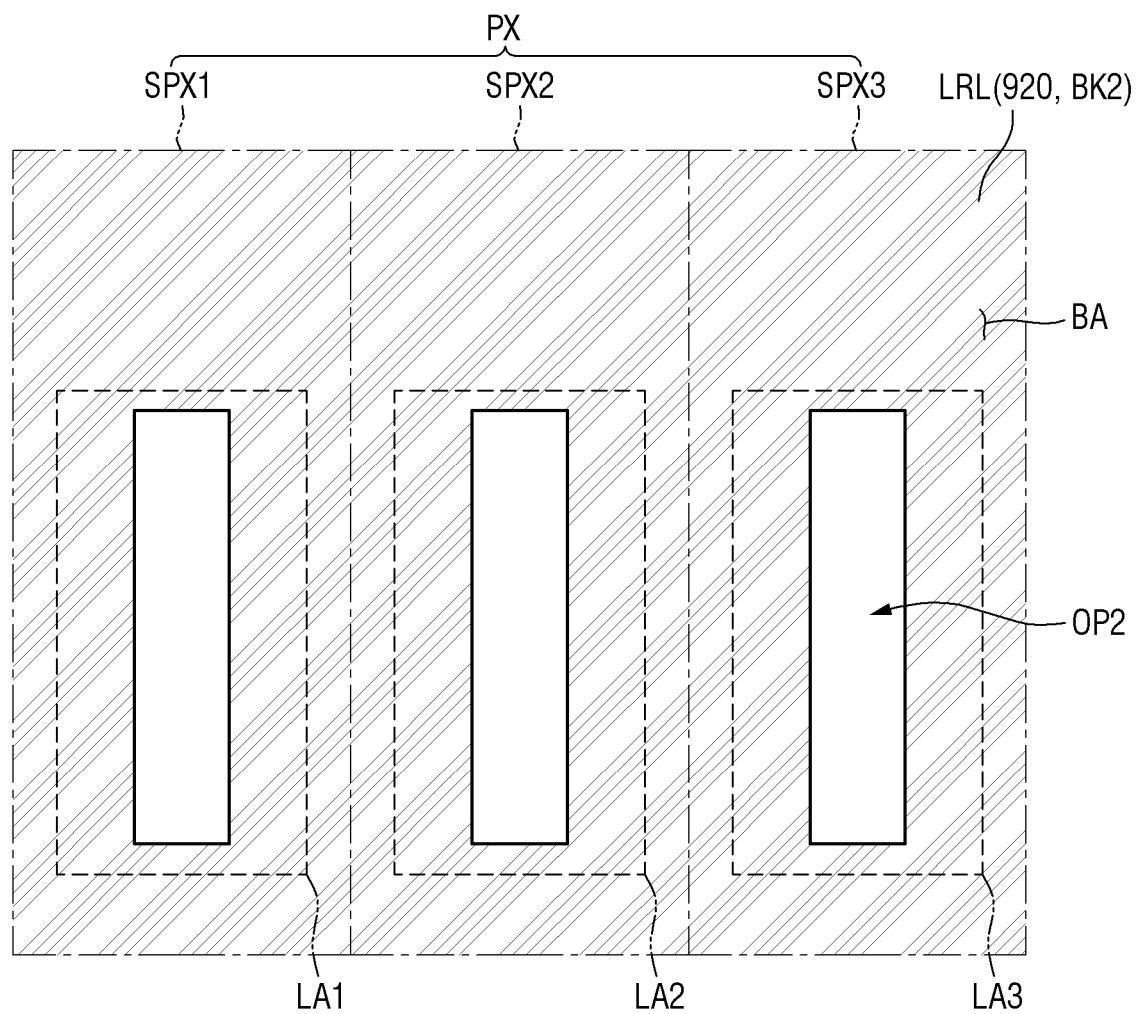
FIG. 10 is a schematic plan view illustrating a relative arrangement of a functional layer according to an embodiment of the disclosure.
Figure 11:
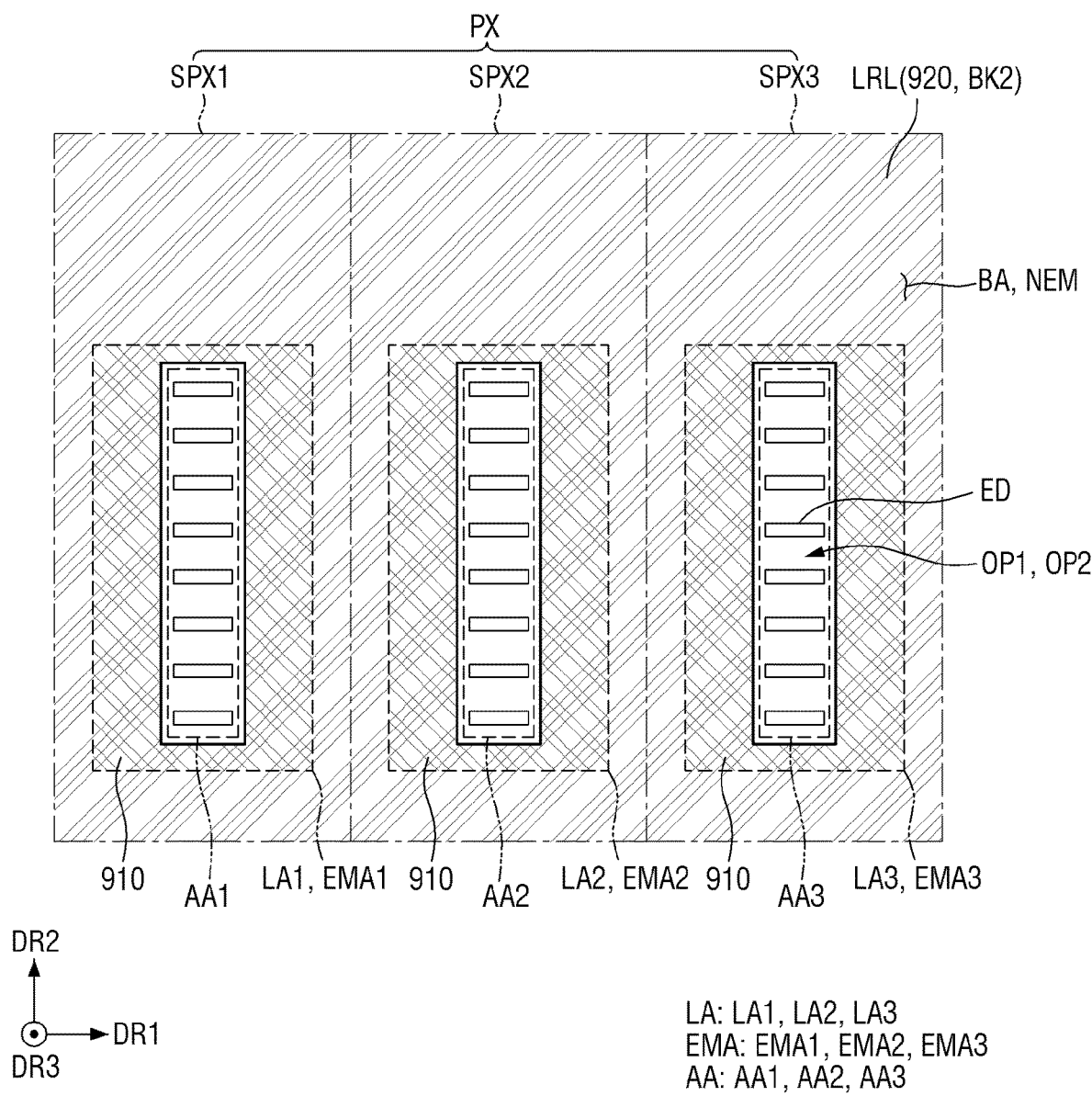
FIG. 11 is a schematic plan view illustrating a relative arrangement of alignment areas, the lower reflective layer and the functional layer according to the embodiment of the disclosure.

FIG. 9 is a schematic plan view illustrating a relative arrangement of a lower reflective layer and a first light-blocking member of a wavelength control layer according to an embodiment. FIG. 10 is a schematic plan view illustrating a relative arrangement of a functional layer according to an embodiment. FIG. 11 is a plan view schematically illustrating a relative arrangement of alignment areas, the lower reflective layer, and the functional layer according to an embodiment.

Referring to FIGS. 9 and 11 in conjunction with FIG. 2, the display device 10 according to an embodiment may include a wavelength control layer WLCL including a lower reflective layer 910 and a first light-blocking member BK1.

In an embodiment, the lower reflective layer 910 may be disposed separately in each of the first to third sub-pixels SPX1, SPX2, and SPX3. The lower reflective layer 910 may be disposed in each of the light exit areas LA, e.g., the first to third light exit areas LA1, LA2, and LA3 of the first to third sub-pixels SPX1, SPX2, and SPX3, respectively. The lower reflective layer 910 may overlap the first to third light exit areas LA1, LA2, and LA3 but may not overlap the light-blocking area BA. The lower reflective layer 910 may be spaced apart from another adjacent lower reflective layer 910 by the first light-blocking member BK1 disposed in the light-blocking area BA. The lower reflective layer 910 may be surrounded by the first light-blocking member BK1.

The lower reflective layer 910 may be disposed below the upper reflective layer 920 with the wavelength conversion layer WCL and the transparent layer TPL interposed therebetween, and may reflect at least part of light reflected by the upper reflective layer 920. The lower reflective layer 910 may reflect at least some of rays of light scattered in the wavelength conversion layer WCL or the transparent layer TPL. The lower reflective layer 910 may reflect light traveling toward the upper surface of the lower reflective layer 910 in the wavelength converting layer WCL and/or the transparent layer TPL so that the light enters again the wavelength converting layer WCL and/or the transparent layer TPL. In this manner, it is possible to improve the efficiency of light exiting out of the wavelength control layer WLCL.

The lower reflective layer 910 disposed in each of the first to third light exit areas LA1, LA2, and LA3 may include a first opening OP1. The first opening OP1 may be a passage through which light emitted from the emission layer EML is incident on the wavelength conversion layer WCL and the transparent layer TPL. Some of the rays of light which are emitted from the emission layer EML and travel to the first opening OP1 penetrating the lower reflective layer 910 may be incident on the wavelength conversion layer WCL and the transparent layer TPL. Some of the rays of light which are emitted from the emission layer EML and travel to the lower reflective layer 910 may be reflected by the lower reflective layer 910 and travel toward the lower side. Light reflected by the lower reflective layer 910 and traveling toward the lower side may be reflected again by the electrode layer 200 of the emission layer EML and travel to the wavelength control layer WLCL.

Since the first opening OP1 is a passage through which light is incident from the emission layer EML to the wavelength conversion layer WCL and the transparent layer TPL, the efficiency of outputting light can be improved depending on the arrangement and shape of the first opening OP1 in a plan view.

The first opening OP1 may overlap the alignment area AA of the emission layer EML in the third direction DR3. For example, the first opening OP1 located in the first light exit area LA1 may overlap the first alignment area AA1, the first opening OP1 located in the second light exit area LA2 may overlap the second alignment area AA2, and the first opening OP1 located in the third light exit area LA3 may overlap the third alignment area AA3.

As the alignment area AA in which the light-emitting diodes ED is intensively disposed and the first opening OP1 overlap each other, the rays of light emitted from the light-emitting diodes ED may generally travel toward the first opening OP1 located thereabove. Accordingly, the efficiency of outputting blue light emitted from the light-emitting diodes ED of the emission layer EML and incident on the wavelength conversion layer WCL and the transparent TPL through the first opening OP1 can be improved.

The shape of the first opening OP1 may be similar to the shape of the alignment area AA in a plan view. In case that the alignment area AA has a stripe shape extended in the second direction DR2, the shape of the first opening OP1 may also have a stripe shape extended in the second direction DR2 in a plan view.

The first light-blocking member BK1 may be disposed in a grid shape surrounding the first to third light exit areas LA1, LA2, and LA3 in a plan view.

Referring to FIGS. 10 and 11 in conjunction with FIG. 2, the display device 10 according to an embodiment may include a functional layer LRL including an upper reflective layer 920 and a second light-blocking member BK2. As described above, the functional layer LRL may be disposed in the first to third light exit areas LA1, LA2, and LA3 and the light-blocking area BA on a first capping layer CAP1.

Similar to the lower reflective layer 910, the functional layer LRL may include a second opening OP2 located in each of the first to third light exit areas LA1, LA2, and LA3. The second opening OP2 may be a passage through which light exits from the wavelength control layer WLCL.

The second opening OP2 may overlap the first opening OP1 in the third direction DR3. Accordingly, the second opening OP2 may overlap the alignment area AA of the emission layer EML in the third direction DR3. For example, the second opening OP2 located in the first light exit area LA1 may overlap the first alignment area AA1, the second opening OP2 located in the second light exit area LA2 may overlap the second alignment area AA2, and the second opening OP1 located in the third light exit area LA3 may overlap the third alignment area AA3.

The shape of the second opening OP2 may be similar to the shape of the first opening OP1 in a plan view. In case that the first opening OP1 has a stripe shape extended in the second direction DR2, the shape of the second opening OP2 may also have a stripe extended in the second direction DR2 in a plan view. In an embodiment, the shape of the second opening OP2 may be identical to the shape of the first opening OP1 in a plan view.

The first opening OP1 penetrating the lower reflective layer 910 may cover the second opening OP2 penetrating the functional layer LRL from below. Accordingly, the second opening OP2 penetrating the functional layer LRL may not overlap the lower reflective layer 910. According to this embodiment, since the second opening OP2 does not overlap the lower reflective layer 910, it is possible to prevent some of the rays of light, which are incident from the outside of the display device 10 and pass through the second opening OP2 to be incident on the wavelength control layer WLCL, from being reflected by the lower reflective layer 910. In other words, as the second opening OP2 through which outside light can pass is formed so that it completely overlaps the first opening OP1, the light passing through the second opening OP2 and incident on the wavelength control layer WLCL can generally travel through the first opening OP1, and thus the light traveling toward the lower reflective layer 910 can be reduced. Accordingly, the reflection of outside light in the display device 10 can be reduced.

Figure 12:
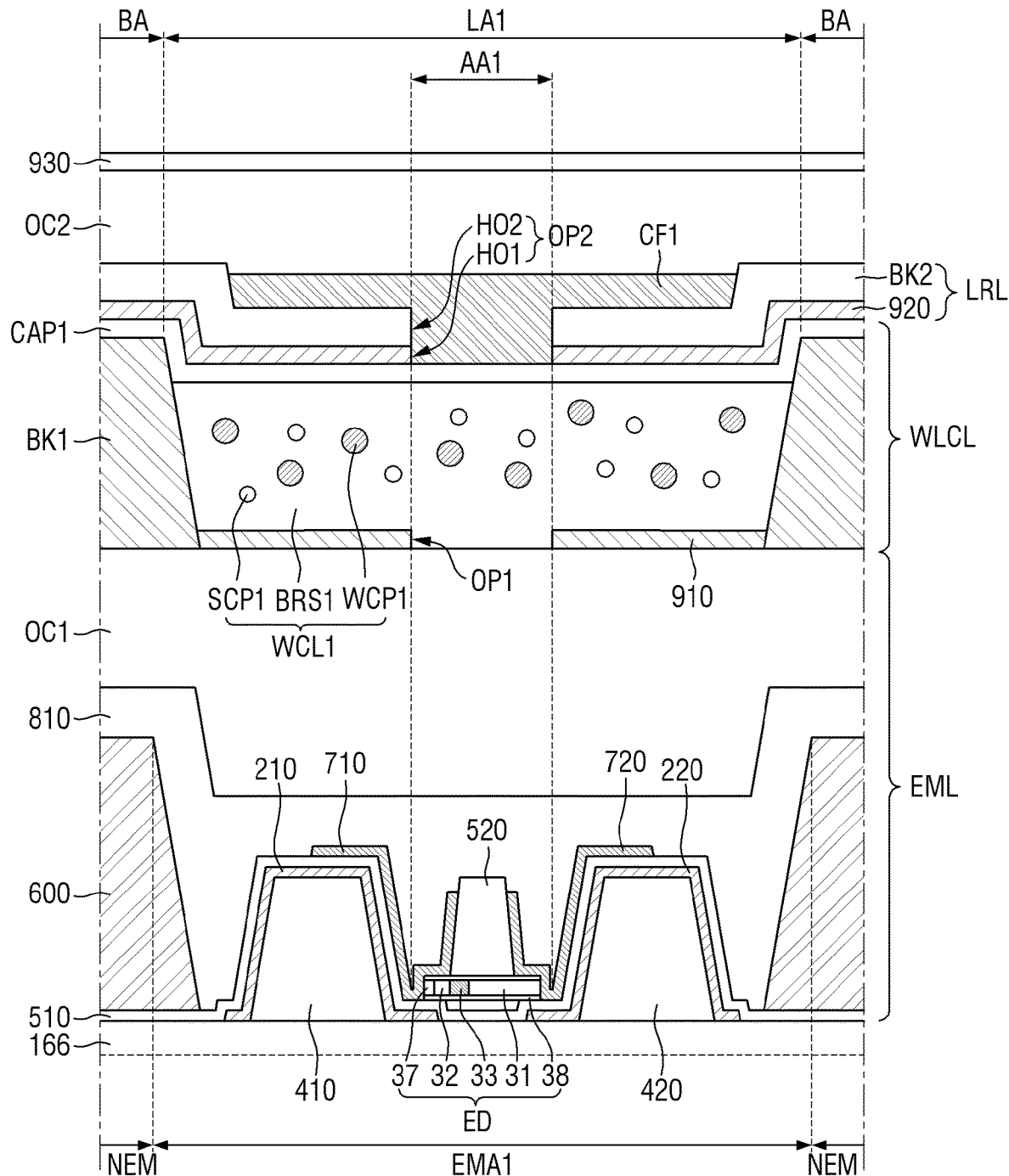
FIG. 12 is a schematic cross-sectional view illustrating a first sub-pixel according to an embodiment.

FIG. 12 is a cross-sectional view schematically illustrating a first sub-pixel according to an embodiment.

Referring to FIG. 12 in conjunction with FIGS. 2 and 11, the lower reflective layer 910 may be disposed under the wavelength conversion layer WCL and the transparent layer TPL and may overlap them. For example, the lower reflective layer 910 disposed in the first light exit area LA1 may overlap the first wavelength conversion pattern WCL1, the lower reflective layer 910 disposed in the second light exit area LA2 may overlap the second wavelength conversion pattern WCL2, and the lower reflective layer 910 disposed in the third light exit area LA3 may overlap the first transparent pattern TPL1.

The first light-blocking member BK1 may be disposed to surround the lower reflective layer 910 and the first wavelength conversion pattern WCL1. Although FIG. 12 illustrates that the first light-blocking member BK1 does not overlap the first wavelength conversion pattern WCL1, the disclosure is not limited thereto. In some embodiments, the lower reflective layer 910 is first formed on the first planarization layer OC1, and the first light-blocking member BK1 is formed on the lower reflective layer 910, such that at least part of the first light-blocking member BK1 may surround the edge of the lower reflective layer 910.

The first opening OP1 may overlap the alignment area AA in the third direction DR3. The first opening OP1 may expose the light-emitting diodes ED disposed in the alignment area AA.

The functional layer LRL may include the upper reflective layer 920 and the second light-blocking member BK2.

The upper reflective layer 920 may be disposed above the wavelength control layer WLCL. The upper reflective layer 920 may be disposed above the wavelength conversion layer WCL and the transparent layer TPL. The lower reflective layer 910 may be disposed under the wavelength converting layer WCL and the transparent layer TPL, and the upper reflective layer 920 may be disposed above the wavelength converting layer WCL and the transparent layer TPL.

The upper reflective layer 920 may include a first hole HO1 penetrating the upper reflective layer 920. The first hole HO1 may overlap the first opening OP1 penetrating the lower reflective layer 910 in the third direction DR3.

The second light-blocking member BK2 may be disposed on the upper reflective layer 920. The second light-blocking member BK2 may include a second hole HO2 penetrating the second light-blocking member BK2. The second hole HO2 may overlap the first hole HO1 in the third direction DR3.

The upper reflective layer 920 and the second light-blocking member BK2 may overlap each other to have the same shape in a plan view, and the first hole HO1 and the second hole HO2 may also overlap each other to have a same pattern shape in a plan view. The first hole HO1 and the second hole HO2 may form the second opening OP2, and as described above, light can exit from the wavelength control layer WLCL to the outside through the second opening OP2.

As described above, in the display device 10 according to the embodiment, the lower reflective layer 910 is disposed at the bottom of the wavelength conversion layer WCL, and the functional layer LRL including the upper reflective layer 920 and second light-blocking member BK2 is disposed on the wavelength conversion layer WCL, so that it is possible to suppress or reduce reflection of outside light and improve the efficiency of outputting light.

Figure 13:
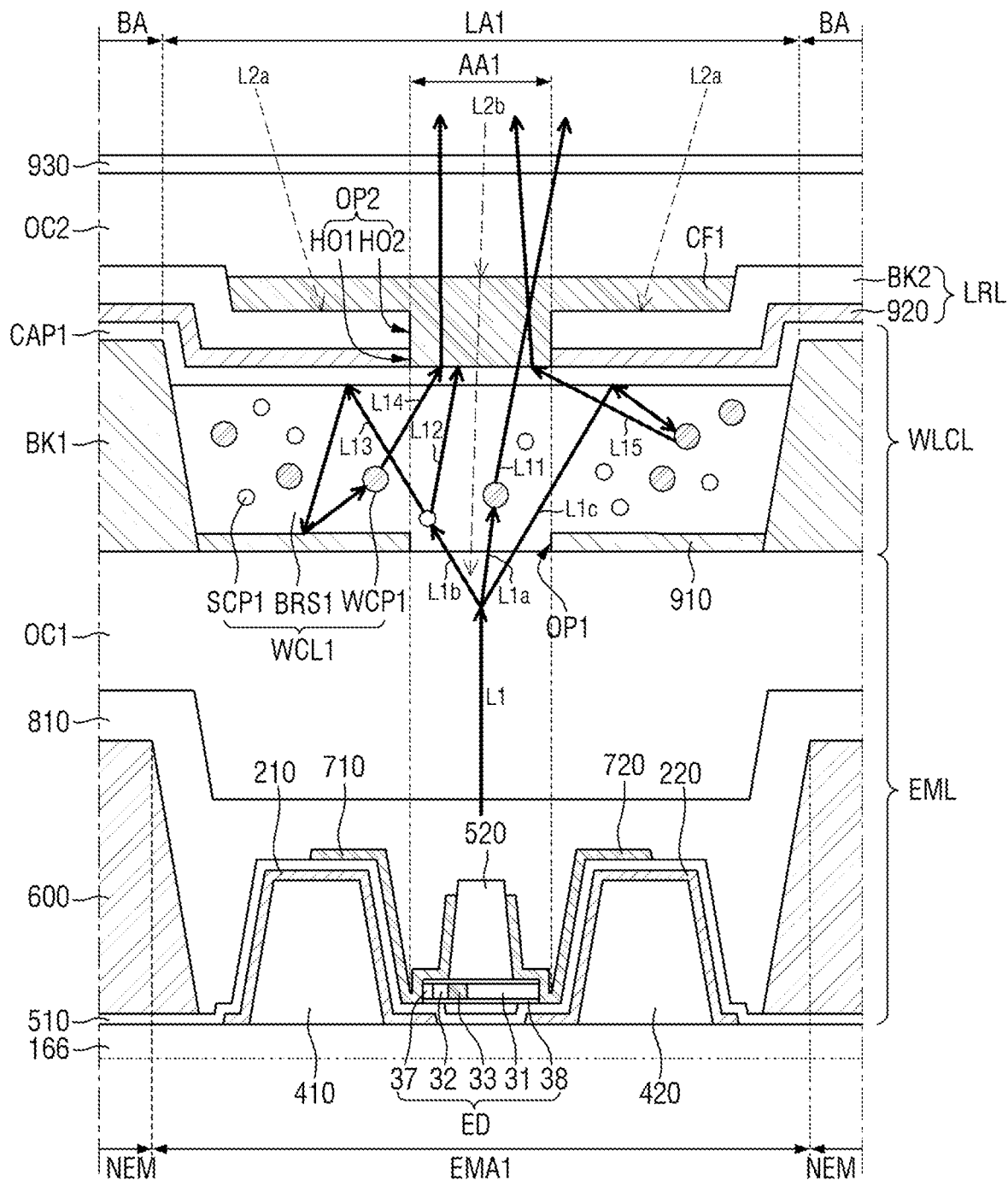
FIG. 13 is a schematic cross-sectional view illustrating traveling directions of light emitted from an emission layer or outside light.

FIG. 13 is a cross-sectional view schematically illustrating traveling directions of rays of light emitted from an emission layer or outside light.

Referring to FIG. 13, rays of light may include first rays of light L1 which are emitted from the emission layer EML and incident on the wavelength control layer WLCL, and second rays of light L2 (or outside light) which incident on the display device 10 from the outside. The first rays of light L1 may be blue rays of light as described above.

At least some of the first rays of light L1 may pass through the first opening OP1 of the lower reflective layer 910 to be incident on the first wavelength conversion pattern WCL1.

Light L1a among the rays of light L1 incident on the first wavelength conversion pattern WCL1 may be converted into red light L11 by the first wavelength conversion pattern WCP1, and may pass through the second opening OP2 of the functional layer LRL to be incident on the first color filter CF1. The red light L11 incident on the first color filter CF1 may transmit the first color filter CF1 and may be output to the outside of the display device 10.

Light L1b among the rays of light L1 incident on the first wavelength conversion pattern WCL1 may be scattered by first scattering particles SCP1, and scattered light L12 may pass through the second opening OP2 of the functional layer LRL to be incident on the first color filter CF1. However, it cannot be output by the first color filter CF1, which blocks blue light. Light L13 scattered by the first scattering particles SCP1 may be reflected by the upper reflective layer 920 to travel to the lower reflective layer 910, and may be reflected again by the lower reflective layer 910 to re-enter the first wavelength conversion pattern WCL1. The light having re-entered the first wavelength conversion pattern WCL1 may be converted into red light L14 by the first wavelength conversion pattern WCP1, and may pass through the second opening OP2 of the functional layer LRL to be incident on the first color filter CF1. The red light L14 incident on the first color filter CF1 may transmit the first color filter CF1 and may be output to the outside of the display device 10.

Light L1c among the first rays of light L1 incident on the first wavelength conversion pattern WCL1 may travel to the upper reflective layer 920 to be reflected by the upper reflective layer 920, and may re-enter the first wavelength conversion pattern WCL1. The light having re-entered the first wavelength conversion pattern WCL1 may be converted into red light L15 by the first wavelength conversion pattern WCP1, and may pass through the second opening OP2 of the functional layer LRL to be incident on the first color filter CF1. The red light L15 incident on the first color filter CF1 may transmit the first color filter CF1 and may be output to the outside of the display device 10.

According to the embodiment, the first light L1 emitted from the emission layer EML and incident on the first wavelength conversion pattern WCL1 may travel toward the upper side in the first wavelength conversion pattern WCL1 and may be reflected by the upper reflective layer 920, such that it may travel to the lower reflective layer 910 and may be reflected again by the lower reflective layer 910 to re-enter the first wavelength conversion pattern WCL1. For example, the first light L1 incident on the first wavelength conversion pattern WCL1 from the emission layer EML may be recycled in the first wavelength conversion layer WCL1 by the upper reflective layer 920 and the lower reflective layer 910, so that the efficiency of converting the first light L1, e.g., blue light, into red light can be increased. Therefore, the efficiency of outputting red light from the first sub-pixel SPX1 can be increased.

Some of rays of the outside light L2 can be blocked by the first color filter CF1. Light L2a among the outside light L2 may be incident on the second light-blocking member BK2 and may be absorbed by the second light-blocking member BK2. Light L2b among the outside light L2 may pass through the second opening OP2 to be incident on the first wavelength conversion pattern WCL1. As described above, since the lower reflective layer 910 and the functional layer LRL are formed so that the first opening OP1 and the second opening OP2 overlap each other, the amount of second rays of light L2 which are incident on the first wavelength conversion layer WCL1 through the second opening OP2 and travel to the lower reflective layer 910 can be reduced. Therefore, it is possible to reduce the reflection of outside light.

Figure 14:
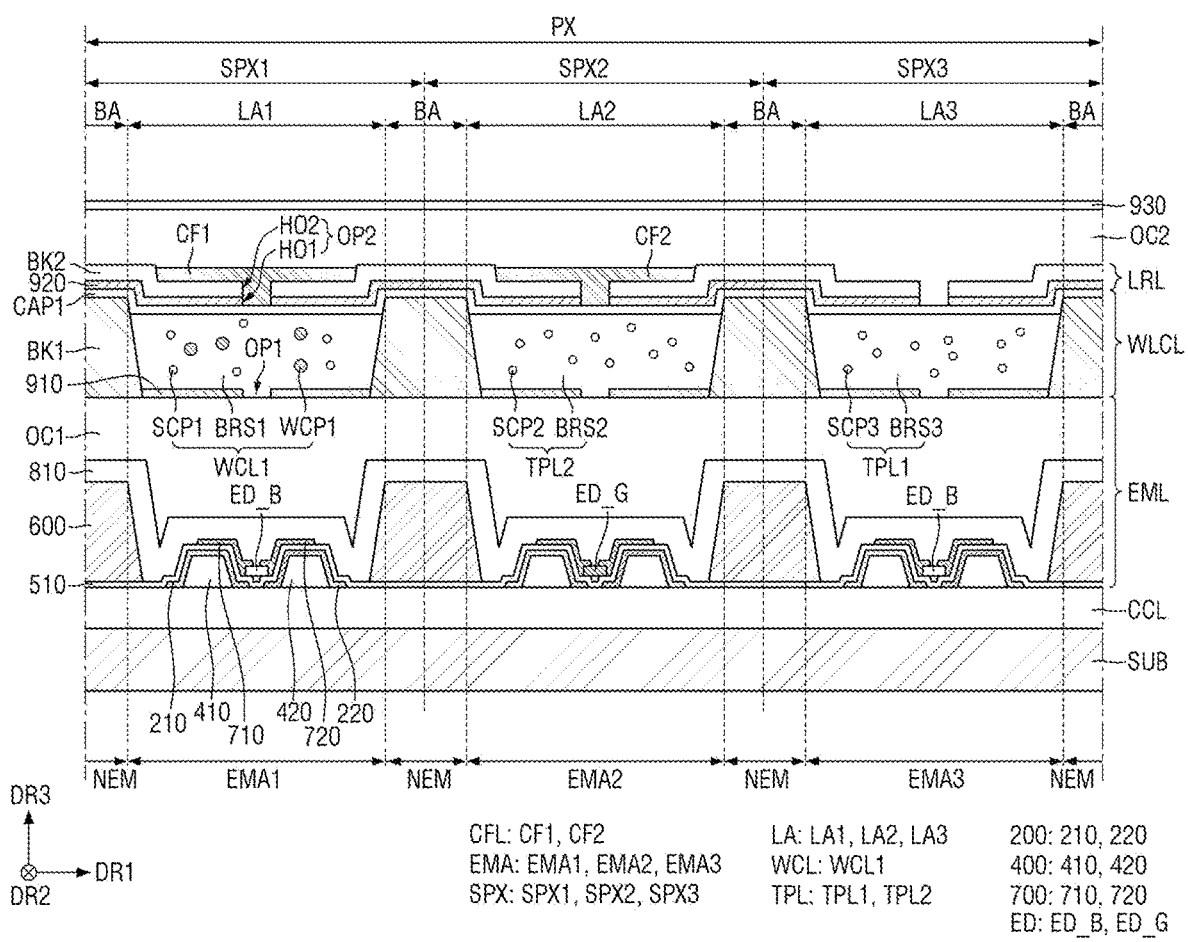
FIG. 14 is a schematic cross-sectional view illustrating a pixel of a display device according to another embodiment of the disclosure.

FIG. 14 is a cross-sectional view schematically illustrating a pixel of a display device according to an embodiment.

The embodiment of FIG. 14 is different from the embodiment of FIG. 2 in that the type of light-emitting diodes ED disposed in a first sub-pixel SPX1 and a third sub-pixel SPX3 is different from the type of light-emitting diodes ED disposed in a second sub-pixel SPX2.

The light-emitting diodes ED may include first-type light-emitting diodes ED_B and second-type light-emitting diodes ED_G. The first-type light-emitting diodes ED_B may be light-emitting diodes ED that emit light of the third color (blue light), and the second-type light-emitting diodes ED_G may be light-emitting diodes ED that emit light of the second color (green light).

The first-type light-emitting diodes ED_B may be disposed in the first emission area EMA1 of the first sub-pixel SPX1 and the third emission area EMA3 of the third sub-pixel SPX3, while the second-type light-emitting diodes ED_G may be disposed in the third emission area EMA3 of the second sub-pixel SPX3.

In the second sub-pixel SPX2 in which the second-type light-emitting diodes ED_G emitting light of the second color are disposed, the light incident from the emission layer EML may have the same color as the color of the sub-pixel SPX. Accordingly, the transparent layer TPL may be disposed in the second sub-pixel SPX2.

According to this embodiment, the transparent layer TPL may include a first transparent pattern TPL1 and a second transparent pattern TPL2. In the second light exit area LA2 of the second sub-pixel SPX2, the second wavelength conversion pattern WCL2 may not be disposed, but a second transparent pattern TPL2 that outputs light without converting the wavelength of the incident light may be disposed. Although the second color filter CF2 is disposed on the second transparent pattern TPL2 in the example shown in FIG. 14, the second color filter CF2 may be omitted.

Figure 15:
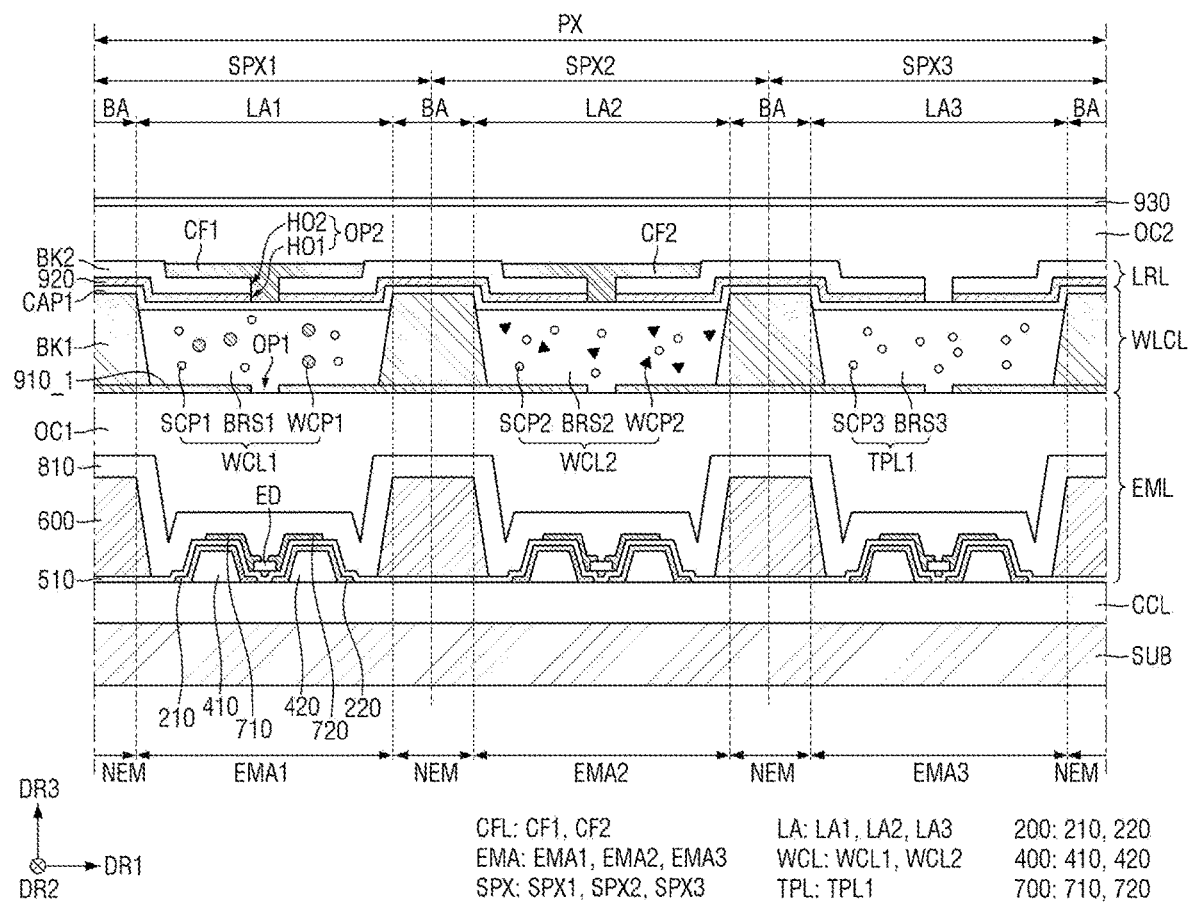
FIG. 15 is a schematic cross-sectional view illustrating a pixel of a display device according to yet another embodiment of the disclosure.
Figure 16:
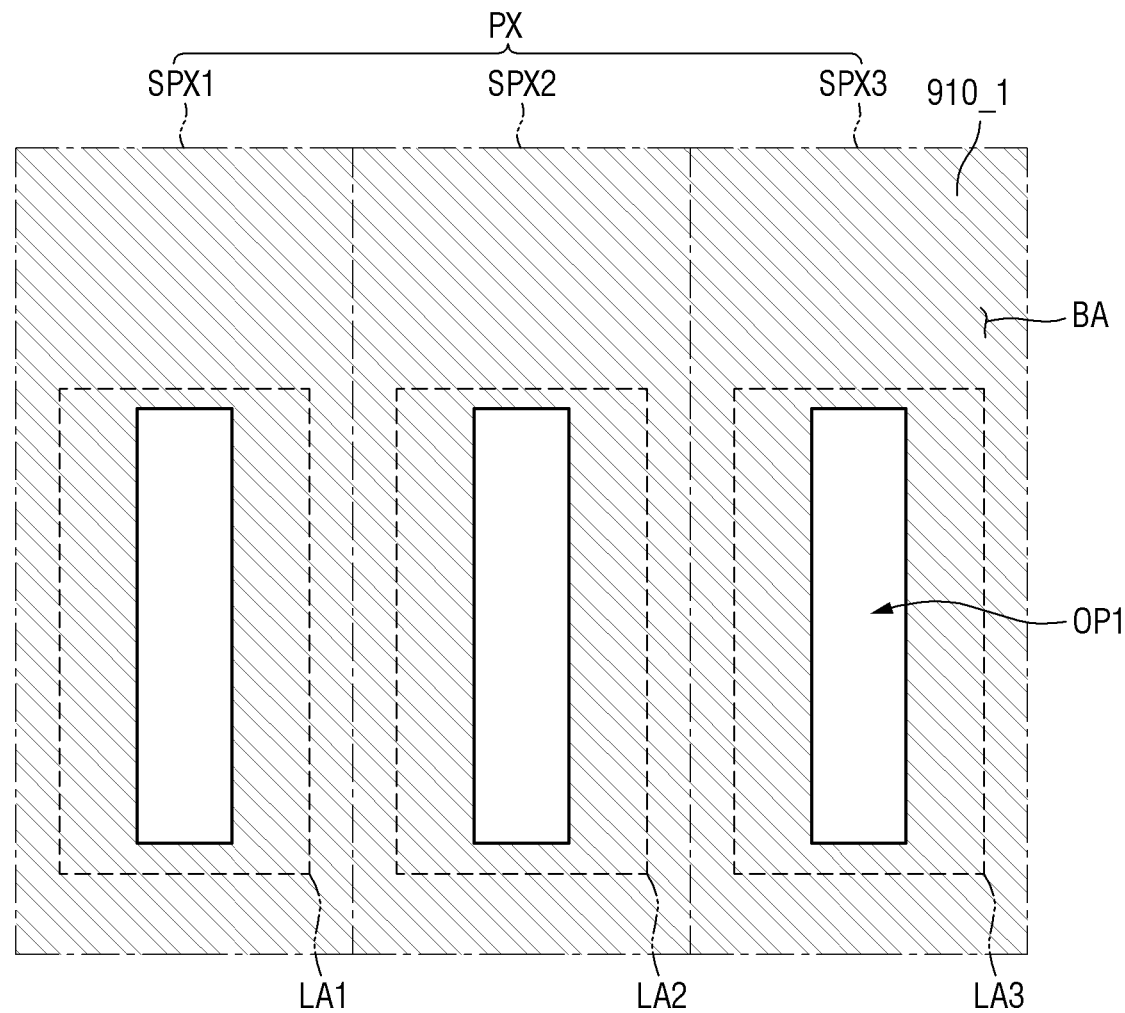
FIG. 16 is a schematic plan view illustrating a layout of the lower reflective layer of FIG. 15.

FIG. 15 is a cross-sectional view schematically illustrating a pixel of a display device according to yet another embodiment of the disclosure. FIG. 16 is a schematic plan view illustrating a layout of the lower reflective layer of FIG. 15.

The embodiment(s) of FIGS. 15 and 16 is different from the embodiment of FIG. 2 in that a lower reflective layer 910_1 is disposed also in a light-blocking area BA in a display device 10. In the following description, descriptions will focus on differences, and repetitive descriptions will be omitted.

The lower reflective layer 910_1 may be disposed in first to third light exit areas LA1, LA2, and LA3 and the light-blocking area BA on a first planarization layer OC1.

The lower reflective layer 910_1 may be formed on the entire surface of the first planarization layer OC1, and may include a first opening OP1 located in each of the first to third light exit areas LA1, LA2, and LA3. For example, the lower reflective layers 910_1 disposed in the first to third sub-pixels SPX1, SPX2, and SPX3 may not be disconnected but may be formed integrally as a single pattern (or may be integral with each other).

The first light-blocking member BK1 may be disposed on the lower reflective layer 910_1. The lower reflective layer 910_1 may overlap the second bank 600 of the emission layer EML and the first light-blocking member BK1.

According to this embodiment, the shape of the lower reflective layer 910_1 may be identical to the shape of the upper reflective layer 920 and the second light-blocking member BK2 of the functional layer LRL in a plan view. Accordingly, an additional design for forming the lower reflective layer 910_1 can be omitted, and thus the efficiency of process of fabricating the display device 10 can be improved.

As the area of the lower reflective layer 910 is increased, more rays of light which travel from the upper reflective layer 920 or the emission layer EML to the lower reflective layer 910 can be reflected by the lower reflective layer 910, so that the efficiency of outputting light of the display device 10 can be improved.

Figure 17:
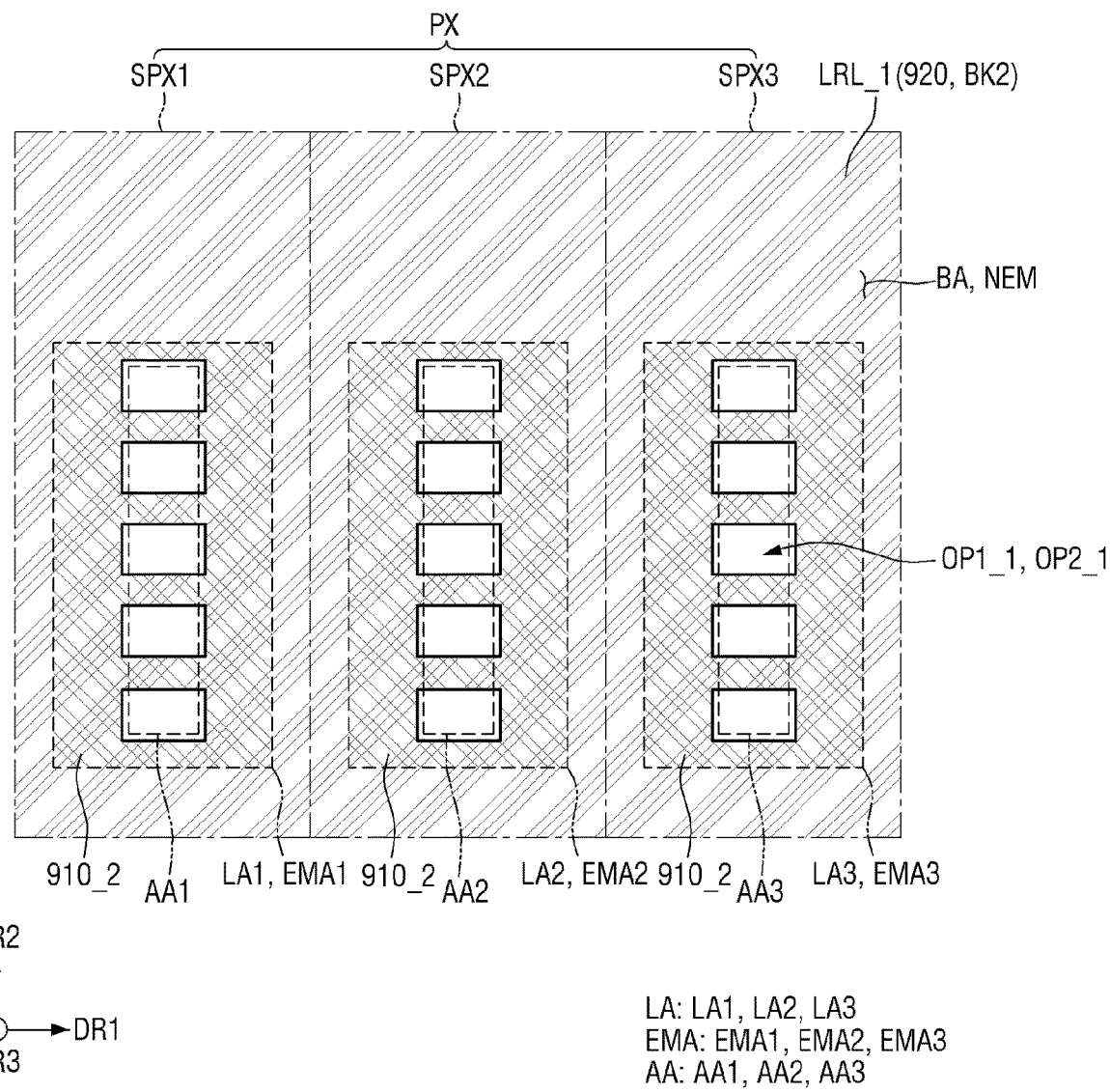
FIG. 17 is a schematic plan view schematically illustrating a relative arrangement of alignment areas, a lower reflective layer and a functional layer according to another embodiment of the disclosure.

FIG. 17 is a plan view schematically illustrating a relative arrangement of alignment areas, a lower reflective layer, and a functional layer according to another embodiment of the disclosure.

As shown in FIG. 17, first openings OP1_1 and second openings OP2_1 may overlap the alignment area AA and may have a shape of dots, which are spaced apart from each other in the second direction DR2. Although FIG. 17 illustrates that the first openings OP1_1 and the second openings OP2_1 have the shape of rectangular dots in a plan view, the disclosure is not limited thereto. For example, the first openings OP1_1 and the second openings OP2_1 may have a shape of circular dots in a plan view, or they may be arranged in a shape of circular dots or in a shape of polygonal dots other than rectangular dots. In addition, although the first openings OP1_1 and the second openings OP2_1 are aligned in a single column in the drawing, the disclosure is not limited thereto. For example, a lower reflective layer 910_2 and the functional layer LRL_1 may have a mesh shape in a plan view, and the first openings OP1_1 and the second openings OP2_1 may overlap alignment areas AA and may have a shape of dots consisting of columns and rows.

Figure 18:
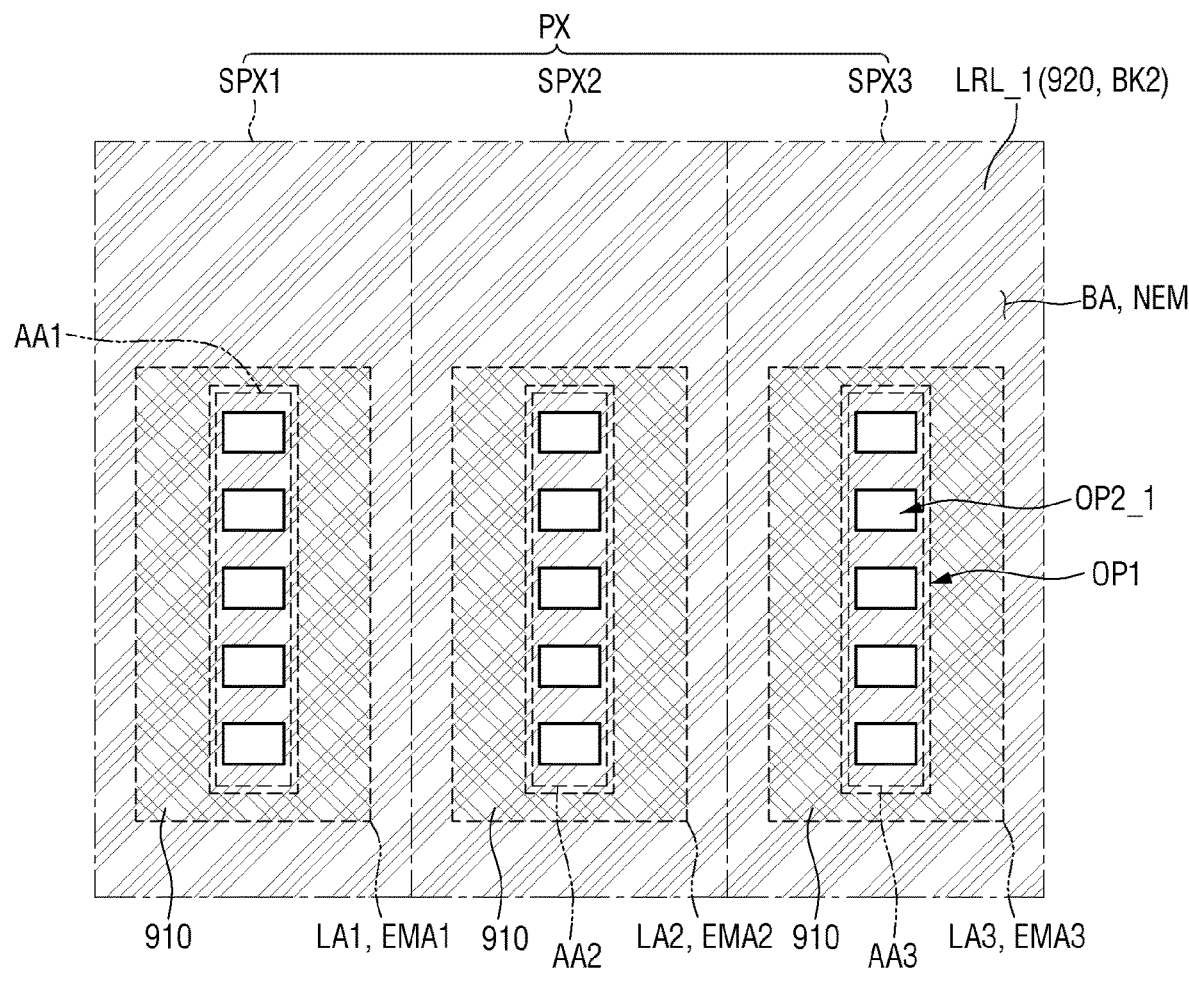
FIG. 18 is a schematic plan view schematically illustrating a relative arrangement of alignment areas, a lower reflective layer and a functional layer according to yet another embodiment of the disclosure.

FIG. 18 is a plan view schematically illustrating a relative arrangement of alignment areas, a lower reflective layer, and a functional layer according to yet another embodiment of the disclosure.

The embodiment of FIG. 18 is different from the embodiment of FIG. 17 in that the shape of first openings OP1 is different from the shape of second openings OP2_1 in a plan view.

The first openings OP1 included in a lower reflective layer 910 may overlap alignment areas AA and may have a shape of stripes extended in the second direction DR2. The second openings OP2_1 included in a functional layer LRL_1 may overlap the alignment areas AA and may have a shape of dots spaced apart from each other in the second direction DR2.

The second opening OP2_1 having the shape of dots may overlap the first openings OP1. The first openings OP1 may cover the second openings OP2_1 from below the second openings OP2_1. For example, the total area of the second openings OP2_1 included in the functional layer LRL_1 may be equal to or less than the total area of the first openings OP1 included in the lower reflective layer 910. Also in this instance, since the second openings OP2_1 included in the functional layer LRL_1 overlap the first openings OP1 included in the lower reflective layer 910, the lower reflective layer 910 may not be exposed by the second openings OP2_1. Accordingly, the second openings OP2_1 may not overlap the lower reflective layer 910. The functional layer LRL_1 may be disposed above the lower reflective layer 910 and may cover the lower reflective layer 910 in the third direction DR3.

According to this embodiment, although the shape of the first openings OP1 and the shape of the second openings OP2 are different from each other in a plan view, the first openings OP1 and the second openings OP2_1 are formed so that the functional layer LRL_1 disposed above the lower reflective layer 910 can cover (or overlap) the lower reflective layer 910 in the third direction DR3, and thus it is possible to reduce the reflection of outside light. As the areas of the lower reflective layer 910 and the upper reflective layer 920 increase, the amount of the rays of light which are reflected by the lower reflective layer 910 and the upper reflective layer 920 and recycled in the wavelength conversion layer WCL or the transparent layer TPL can be increased. Therefore, the efficiency of outputting light of the display device 10 can be improved.

Figure 19:
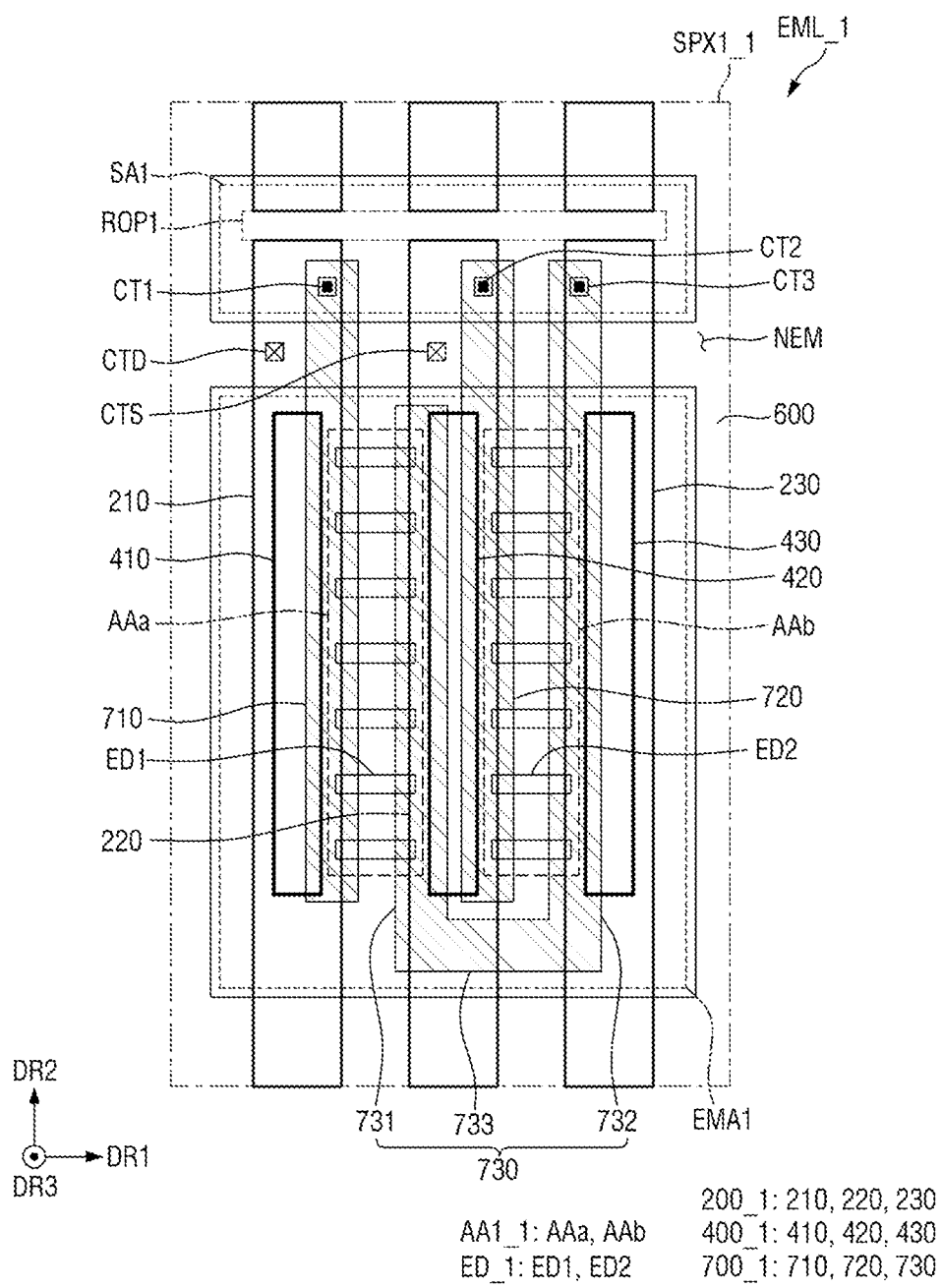
FIG. 19 is a schematic plan view illustrating a layout of an emission layer of a sub-pixel according to another embodiment of the disclosure.
Figure 20:
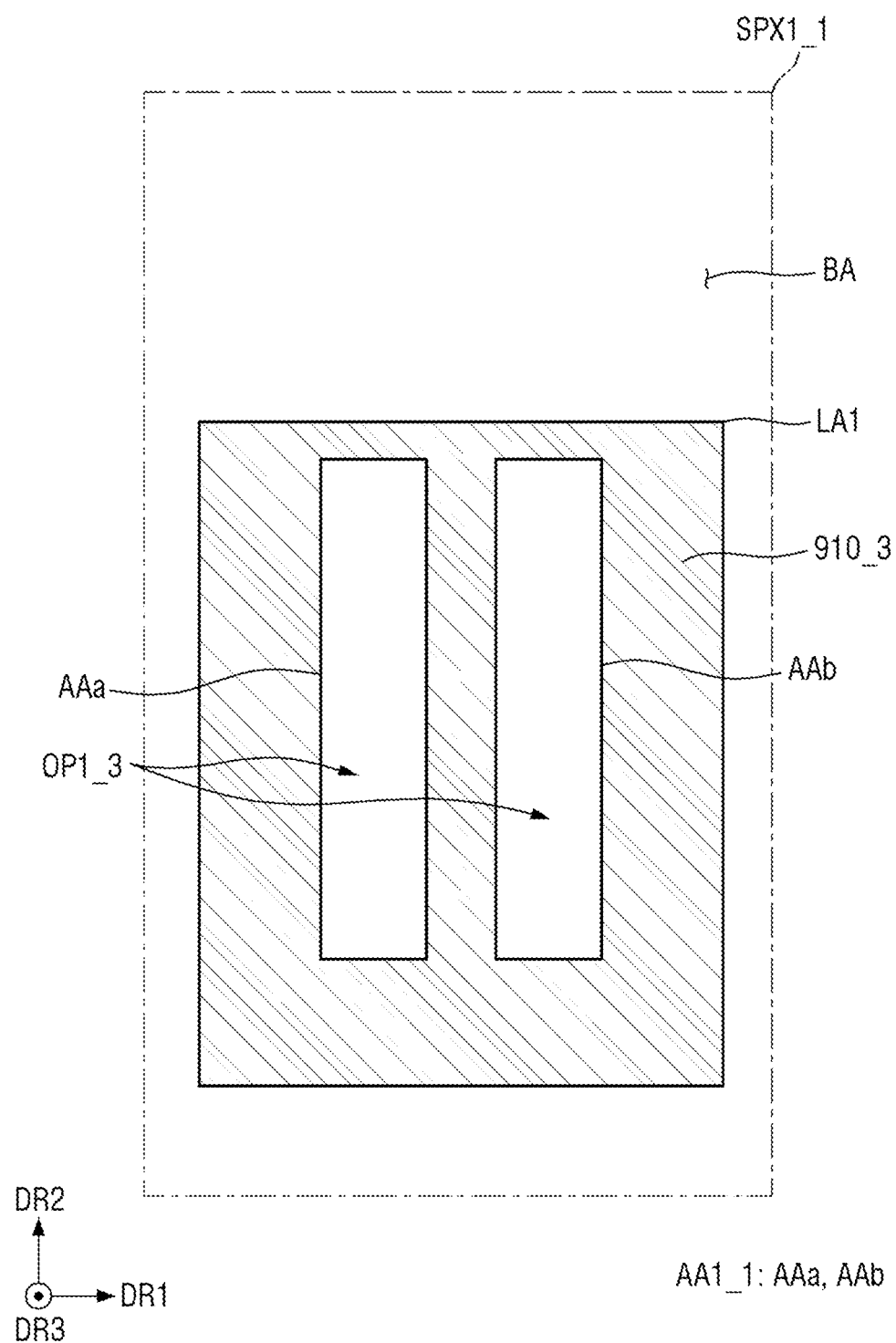
FIG. 20 is a schematic plan view illustrating a layout of a lower reflective layer included in a wavelength control layer of the display device including the emission layer of FIG. 19.
Figure 21:
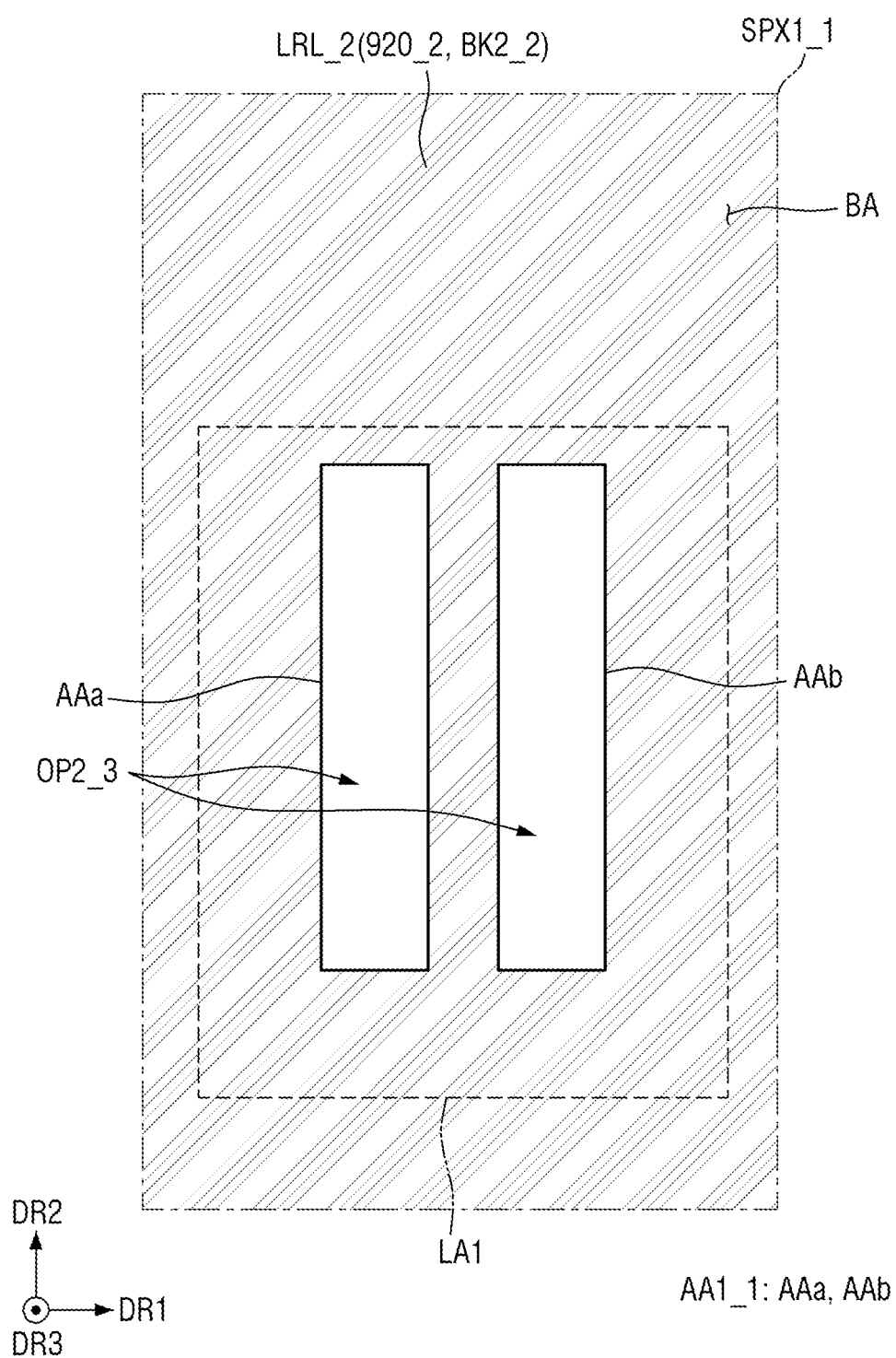
FIG. 21 is a schematic plan view illustrating a layout of a functional layer of the display device including the emission layer of FIG. 19.

FIG. 19 is a schematic plan view illustrating a layout of an emission layer of a sub-pixel according to an embodiment. FIG. 20 is a schematic plan view illustrating a layout of a lower reflective layer included in a wavelength control layer of the display device including the emission layer of FIG. 19. FIG. 21 is a schematic plan view illustrating a layout of a functional layer of the display device including the emission layer of FIG. 19. FIG. 22 is a cross-sectional view schematically illustrating a first sub-pixel according to the embodiment of FIG. 19.

The embodiment of FIG. 19 is different from the embodiment of FIG. 4 in that an emission layer EML_1 included in a first sub-pixel SPX1_1 includes an electrode layer 200_1 further including a third electrode 230, a first bank 400_1 further including a third sub-bank 430, and a contact electrode 700_1 further including a third contact electrode 730.

According to this embodiment, the first bank 400_1 may further include the third sub-bank 430 spaced apart from the first sub-bank 410 and the second sub-bank 420. The third sub-bank 430 may be spaced apart from the first sub-bank 410 and the second sub-bank 420 in the first direction DR1 with the second sub-bank 420 therebetween.

The electrode layer 200_1 may further include the third electrode 230 spaced apart from the first electrode 210 and the second electrode 220. The third electrode 230 may be spaced apart from the first electrode 210 and the second electrode 220 in the first direction DR1. The second electrode 220 may be disposed between the first electrode 210 and the third electrode 230. The third electrode 230 may be disposed on the third sub-bank 430. Unlike the first electrode 210 and the second electrode 220, the third electrode 230 may not be electrically connected to the circuit element layer CCL.

A first alignment area AA1_1 may include a first sub-alignment area AAa and a second sub-alignment area AAb. The first sub-alignment area AAa and the second sub-alignment area AAb may be spaced apart from each other in the first direction DR1.

The first sub-alignment area AAa may include an area between the first sub-bank 410 and the second sub-bank 420, and may be located on the left side in the first emission area EMA1 in a plan view. The second sub-alignment area AAb may include an area between the second sub-bank 420 and the third sub-bank 430, and may be located on the right side in the first emission area EMA1 in a plan view.

A light-emitting diodes ED_1 may include first light-emitting diodes ED1 and second light-emitting diodes ED2. The first light-emitting diodes ED1 may be disposed in the first sub-alignment area AAa, and the second light-emitting diodes ED2 may be disposed in the second sub-alignment area AAb. The first light-emitting diodes ED1 may be disposed so that their both ends are placed on the first electrode 210 and the second electrode 220 in the first sub-alignment area AAa, respectively. The second light-emitting diodes ED2 may be disposed so that their both ends are placed on the second electrode 220 and the third electrode 230 in the second sub-alignment area AAb, respectively.

The light-emitting diodes ED disposed in different first and second sub-alignment areas AAa and AAb may be electrically connected in series to each other, and the light-emitting diodes ED disposed in the same sub-alignment areas AAa and AAb may be electrically connected in parallel to each other. For example, the first light-emitting diodes ED1 disposed in the first sub-alignment area AAa and the second light-emitting diodes ED2 disposed in the second sub-alignment area AAb may be electrically connected in series to each other. The first light-emitting diodes ED1 disposed in the first sub-alignment area AAa may be electrically connected in parallel to each other, and the second light-emitting diodes ED2 disposed in the second sub-alignment area AAb may be electrically connected in parallel to each other. The first light-emitting diodes ED1 and the second light-emitting diodes ED2 may be electrically connected in series to each other through a third contact electrode 730 to be described below.

Referring to FIGS. 19 and 22, a second insulating layer 520_1 may include a first pattern 521 and a second pattern 522.

The first pattern 521 may be disposed on the first light-emitting diodes ED1. The first pattern 521 may be disposed to partially cover the outer surface of the first light-emitting diodes ED1, but may not cover both ends of the first light-emitting diodes ED1.

The second pattern 522 may be disposed on the second light-emitting diodes ED2. The second pattern 522 may be disposed to partially cover the outer surface of the second light-emitting diodes ED2, but may not cover both ends of the second light-emitting diodes ED2.

The first contact electrode 710 may be disposed on the first electrode 210 and may contact first ends of the first light-emitting diodes ED1 and the first electrode 210. The first contact electrode 710 may be electrically connected to the first electrode 210 through a first contact CT1. The first contact electrode 710 may electrically connect the first electrode 210 with first ends of the first light-emitting diodes ED1.

The second contact electrode 720 may be disposed on the second electrode 220 and may contact first ends of the second light-emitting diodes ED2 and the second electrode 220. The second contact electrode 720 may be electrically connected to the second electrode 220 through a second contact CT2. The second contact electrode 720 may electrically connect the second electrode 220 with first ends of the second light-emitting diodes ED2.

The third contact electrode 730 may be spaced apart from the first contact electrode 710 and the second contact electrode 720. The third contact electrode 730 may include a first region 731, a second region 732, and a third region 733.

The first region 731 of the third contact electrode 730 may be disposed on the second electrode 220 and spaced apart from the second contact electrode 720. The first region 731 of the third contact electrode 730 may contact second ends of the first light-emitting diodes ED1.

The second region 732 of the third contact electrode 730 may be disposed on the third electrode 230 and spaced apart from the first region 731 of the third contact electrode 730. The second region 732 of the third contact electrode 730 may contact second ends of the second light-emitting diodes ED2. The second region 732 of the third contact electrode 730 may contact the third electrode 230 through a third contact CT3 in the subsidiary area SA. The second region 732 of the third contact electrode 730 contacts the third electrode 230 through the third contact CT3, and thus it is possible to suppress parasitic capacitance between the second region 732 of the third contact electrode 730 and the third electrode 230.

The third region 733 of the third contact electrode 730 may be disposed between the first region 731 of the third contact electrode 730 and the second region 732 of the third contact electrode 730. The third region 733 of the third contact electrode 730 may be disposed between the first region 731 of the third contact electrode 730 and the second region 732 of the third contact electrode 730 to electrically connect them to each other.

The first contact electrode 710 may contact the first electrode 210 and the first ends of the first light-emitting diodes ED1 to electrically connect the first electrode 210 with the first light-emitting diodes ED1. The second contact electrode 720 may contact the second electrode 220 and the first ends of the second light-emitting diodes ED2 to electrically connect the second electrode 220 with the second light-emitting diodes ED2. The third contact electrode 730 may contact the second ends of the first light-emitting diodes ED1 and the second ends of the second light-emitting diodes ED2 to electrically connect the first light-emitting diodes ED1 with the second light-emitting diodes ED2 in series.

Referring to FIGS. 20 to 22, a first opening OP1_3 of a lower reflective layer 910_3 included in a first sub-pixel SPX1_1 may have a shape corresponding to the shape of a first alignment area AA1_1 of an emission layer EML_1 in a plan view. The first opening OP1_3 of the lower reflective layer 910_3 may have a stripe shape extended in the second direction DR2 and spaced apart from each other in the first direction DR1. The first opening OP1_3 of the lower reflective layer 910_3 may overlap each of a first sub-alignment area AAa and a second sub-alignment area AAb of the first alignment area AA1_1 in the third direction DR3.

A functional layer LRL_2 may have a shape conforming to the shape of the first opening OP_3 of the lower reflective layer 910_3 in a plan view. Similar to the first opening OP1_3, a second opening OP2_3 of the functional layer LRL_2 may have a stripe shape extended in the second direction DR2 and spaced apart from each other in the first direction DR1. The second opening OP2_3 of the functional layer LRL_2 may overlap the first opening OP1_3 of the lower reflective layer 910_3 in the third direction DR3.

Therefore, an upper reflective layer 920_2 may include a first hole HO1_3 extended in the second direction DR2 and having a stripe shape spaced apart from each other in the first direction DR1, and the second light-blocking member BK2_2 may include a second hole HO2_3 extended in the second direction DR2 and having a stripe shape spaced apart from each other in the first direction DR1. The first hole HO1_3 and the second hole HO2_3 may overlap each other in the third direction DR3.

Figure 23:
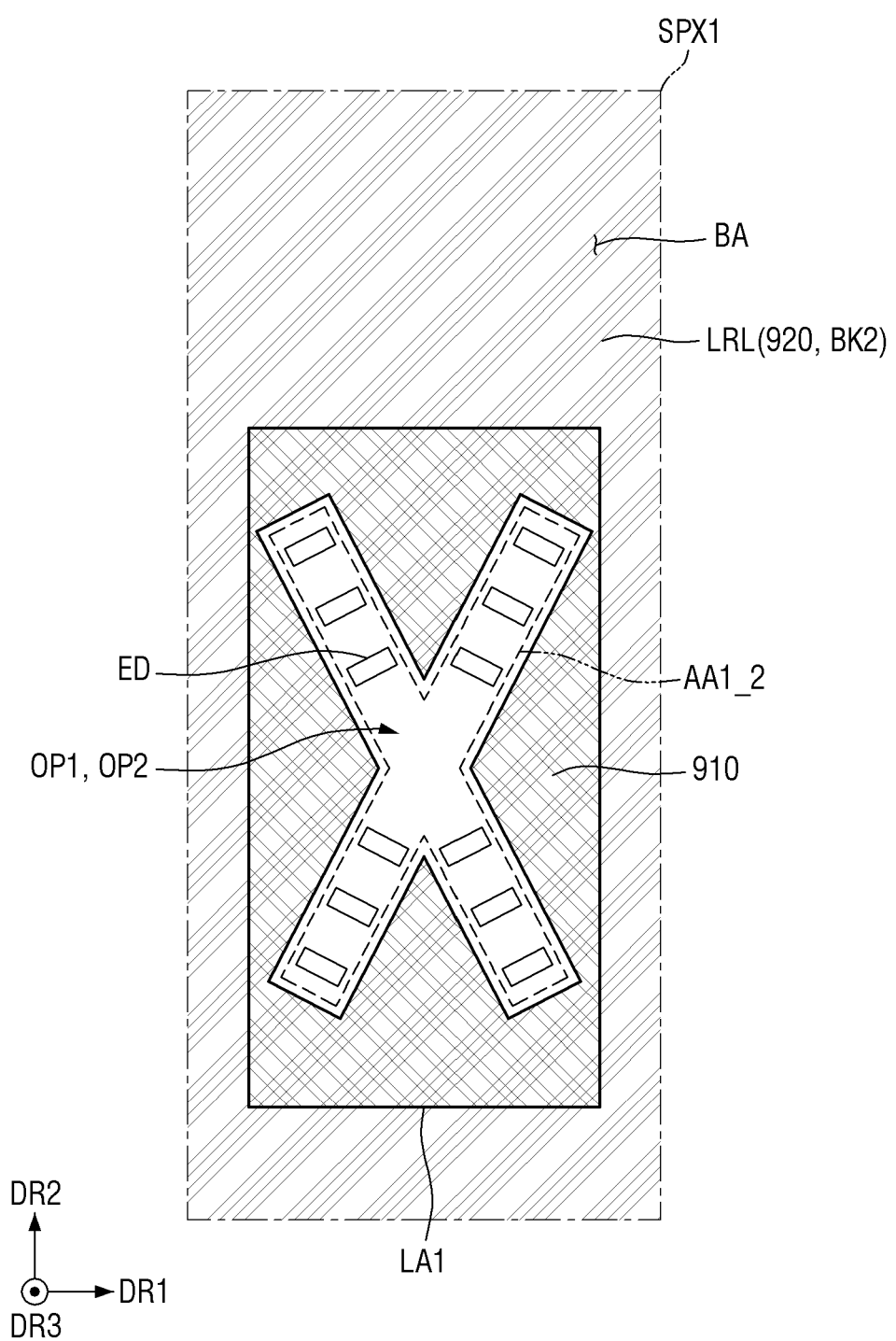
FIGS. 23 to 25 are schematic plan views illustrating a variety of layouts of a first alignment area, a lower reflective layer and a functional layer.
Figure 24:
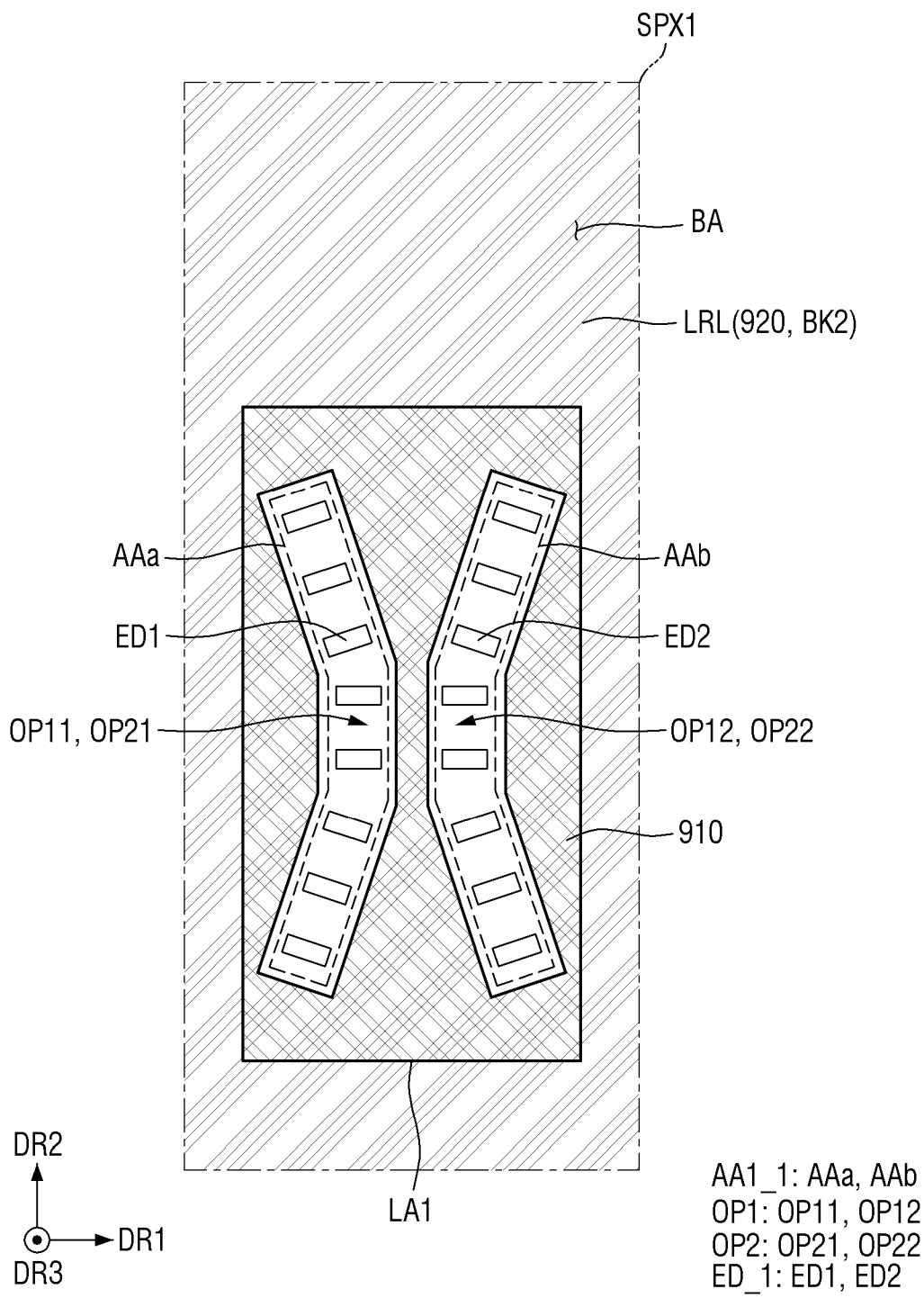
Figure 25:
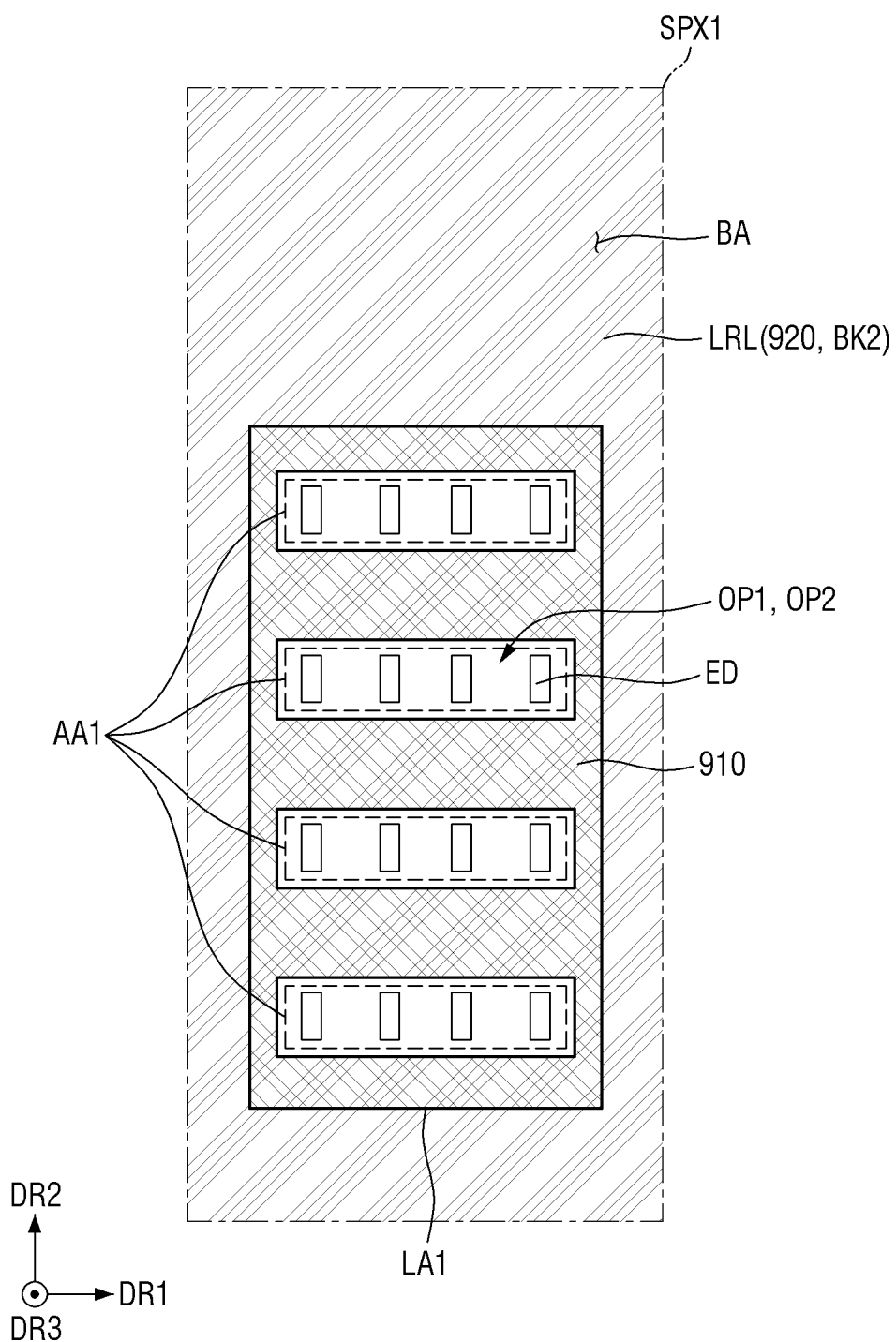

FIGS. 23 to 25 are schematic plan views illustrating a variety of layouts of a first alignment area, a lower reflective layer, and a functional layer included in a first sub-pixel.

Referring to FIG. 23, a first alignment area AA1_2 may have an X-shape in a plan view. In case that the first alignment area AA1_2 has an X-shape, the first opening OP1 of the lower reflective layer 910 and the second opening OP2 of the functional layer LRL may also have an X-shape in a plan view and may overlap the first alignment area AA1_2 in the third direction DR3.

Referring to FIG. 24, the first alignment area AA1_1 may include a first sub-alignment area AAa and a second sub-alignment area AAb spaced apart from each other in the first direction DR1. The first sub-alignment area AAa may be extended in the second direction DR2 and may have an upper end bent to the left side and a lower end bent to the left side. The second sub-alignment area AAb may be extended in the second direction DR2 and may have an upper end bent to the right side and a lower end bent to the right side. The first sub-pixel SPX1 may include a first opening OP1 including a 1-1-th opening OP11 and a 1-2-th opening OP12 and a second opening OP2 including a 2-1-th opening OP21 and a 2-2-th opening OP22.

Referring to FIG. 25, the first alignment areas AA1 may have a stripe shape extended in the first direction DR1 and spaced apart from each other in the second direction DR2. In case that the first alignment areas AA1 have a stripe shape extended in the first direction DR1 and spaced apart from each other in the second direction DR2, the first opening OP1 of the lower reflective layer 910 and the second opening OP2 of the functional layer LRL may also have a stripe shape extended in the first direction DR1 and spaced apart from each other in the second direction DR2 in a plan view.

Figure 26:
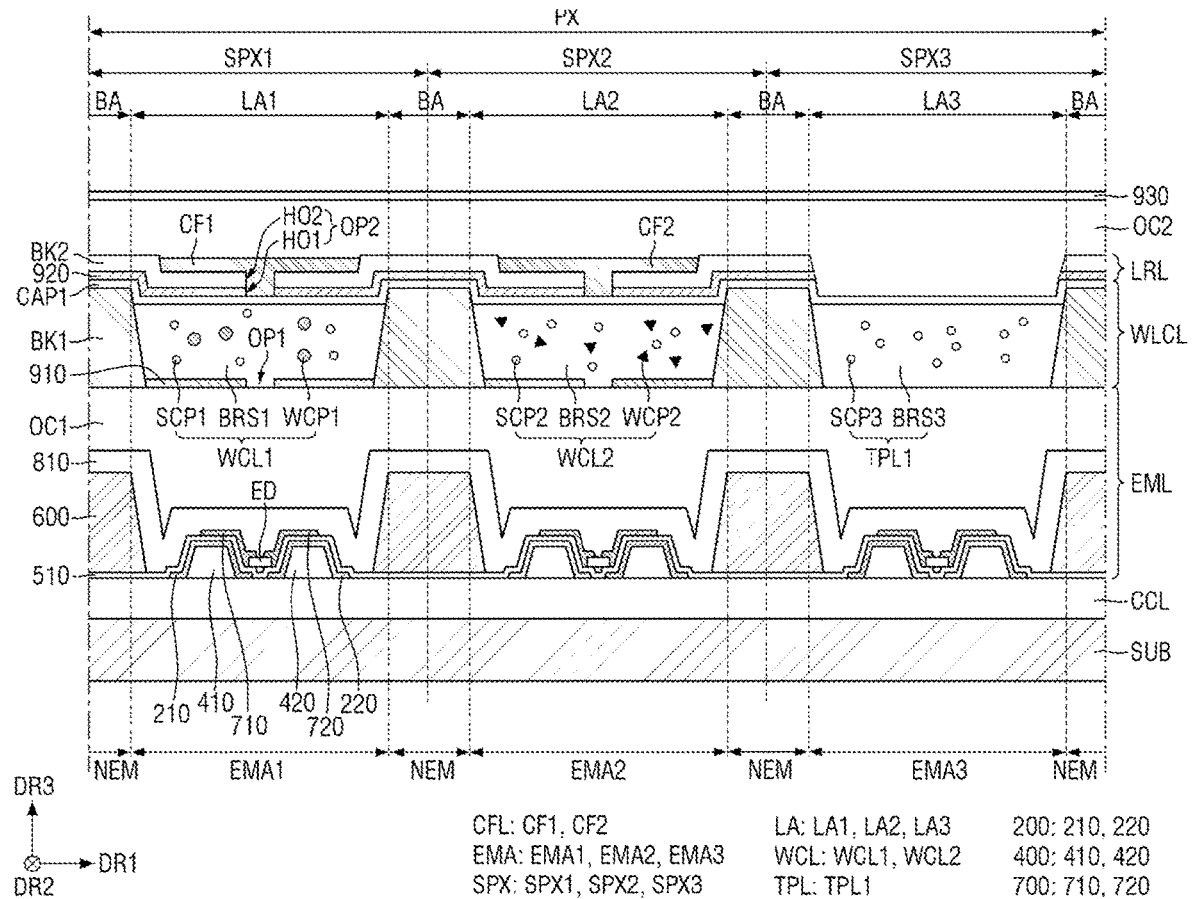
FIG. 26 is a schematic cross-sectional view schematically illustrating a pixel of a display device according to yet another embodiment of the disclosure.
Figure 27:
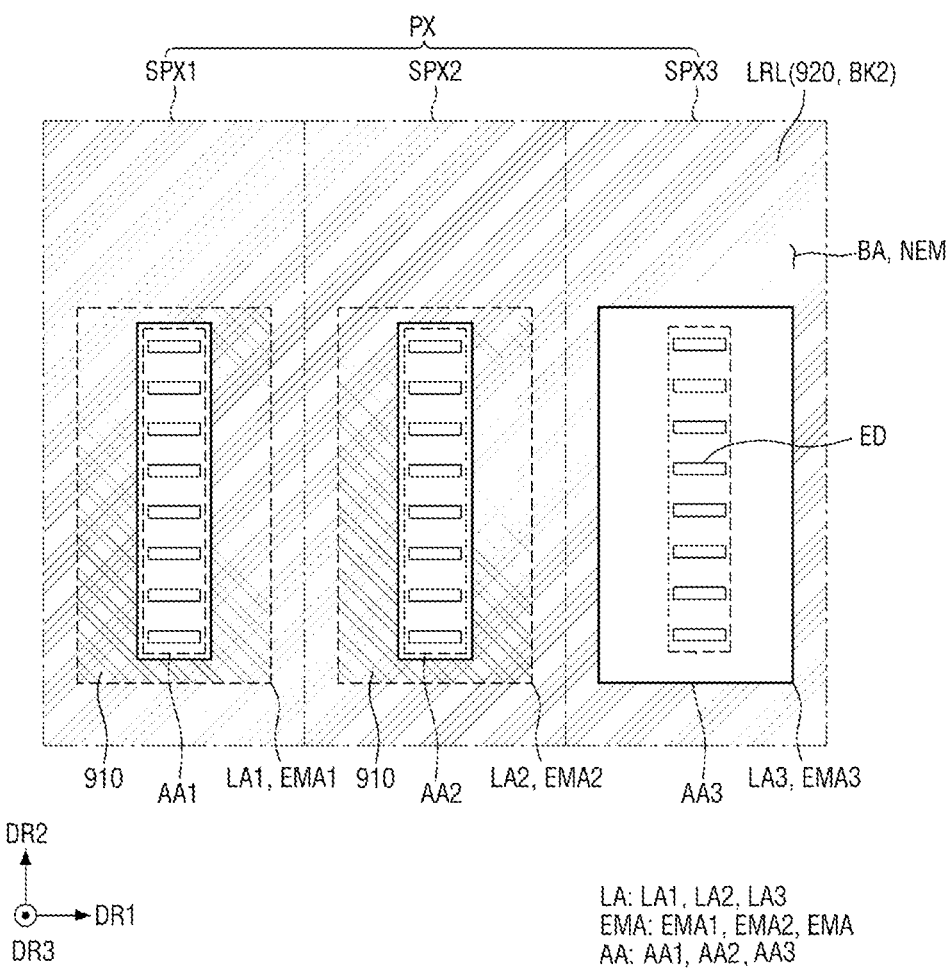
FIG. 27 is a schematic plan view schematically illustrating a relative layout of alignment areas, the lower reflective layer and the functional layer of the display device of FIG. 26.

FIG. 26 is a cross-sectional view schematically illustrating a pixel of a display device according to an embodiment. FIG. 27 is a plan view schematically illustrating a relative arrangement of alignment areas, the lower reflective layer, and the functional layer of the display device of FIG. 26.

The embodiments of FIGS. 26 and 27 are different from the embodiments of FIGS. 2 and 11 in that the lower reflective layer 910 and the functional layer LRL are not disposed in the third light exit area LA3 of the third sub-pixel SPX3.

The lower reflective layer 910 may be disposed in the first light exit area LA1 and the second light exit area LA2 but may not be disposed in the third light exit area LA3. An upper reflective layer 920 and a second light-blocking member BK2 of the functional layer LRL may be disposed in the first light exit area LA1 and the second light exit area LA2 but may not be are disposed in the third light exit area LA3.

The lower reflective layer 910 and the functional layer LRL may overlap the wavelength conversion layer WCL. The lower reflective layer 910 and the functional layer LRL may overlap a first wavelength conversion pattern WCL1 and a second wavelength conversion pattern WCL2 disposed in the first light exit area LA1 and the second light exit area LA2, respectively.

The lower reflective layer 910 and the functional layer LRL may not overlap the transparent layer TPL. The lower reflective layer 910 and the functional layer LRL may not overlap the first transparent pattern TPL1 disposed in the third light exit area LA3.

The lower reflective layer 910 may be disposed in the first and second light exit areas LA1 and LA2 but may not be disposed in the third light exit area LA3 and the light-blocking area BA. It should be understood, however, that the disclosure is not limited thereto. The lower reflective layer 910 may be disposed in the first and second light exit areas LA1 and LA2 and the light-blocking area BA but may not be disposed in the third light exit area LA3. In this case, the lower reflective layer 910 may be disposed on the entire surface of the display area in a plan view, and may include the first openings OP1 overlapping the first alignment area AA1 and the second alignment area AA2, and another opening overlapping the third light exit area LA3. The width of the first openings OP1 may be different from the width of the other opening overlapping the third light exit area LA3. For example, the width of the first openings OP1 may be smaller than the width of the other opening overlapping the third light exit area LA3. Similarly, the functional layer LRL may be disposed in the first and second light exit areas LA1 and LA2 and the light-blocking area BA but may not be disposed in the third light exit area LA3.

According to this embodiment, even though the lower reflective layer 910 and the functional layer LRL are eliminated from the third light exit area LA3 of the third sub-pixel SPX3, the blue light which is emitted from the emission layer EML and is incident on the wavelength control layer WLCL can be output to the outside of the display device 10 through the first transparent pattern TPL1. Since the light emitted from the emission layer EML and incident on the wavelength control layer WLCL has the same color as the color of the third sub-pixel SPX3, there is no need to convert the wavelength of the light in the wavelength control layer WLCL. Therefore, it is not beneficial to improve the efficiency of converting light by the upper reflective layer 920 and the lower reflective layer 910 in the third sub-pixel SPX3. Accordingly, even though the upper reflective layer 910 and the lower reflective layer 920 are eliminated from the third sub-pixel SPX3, the efficiency of outputting light and the color gamut can be maintained.

Figure 28:
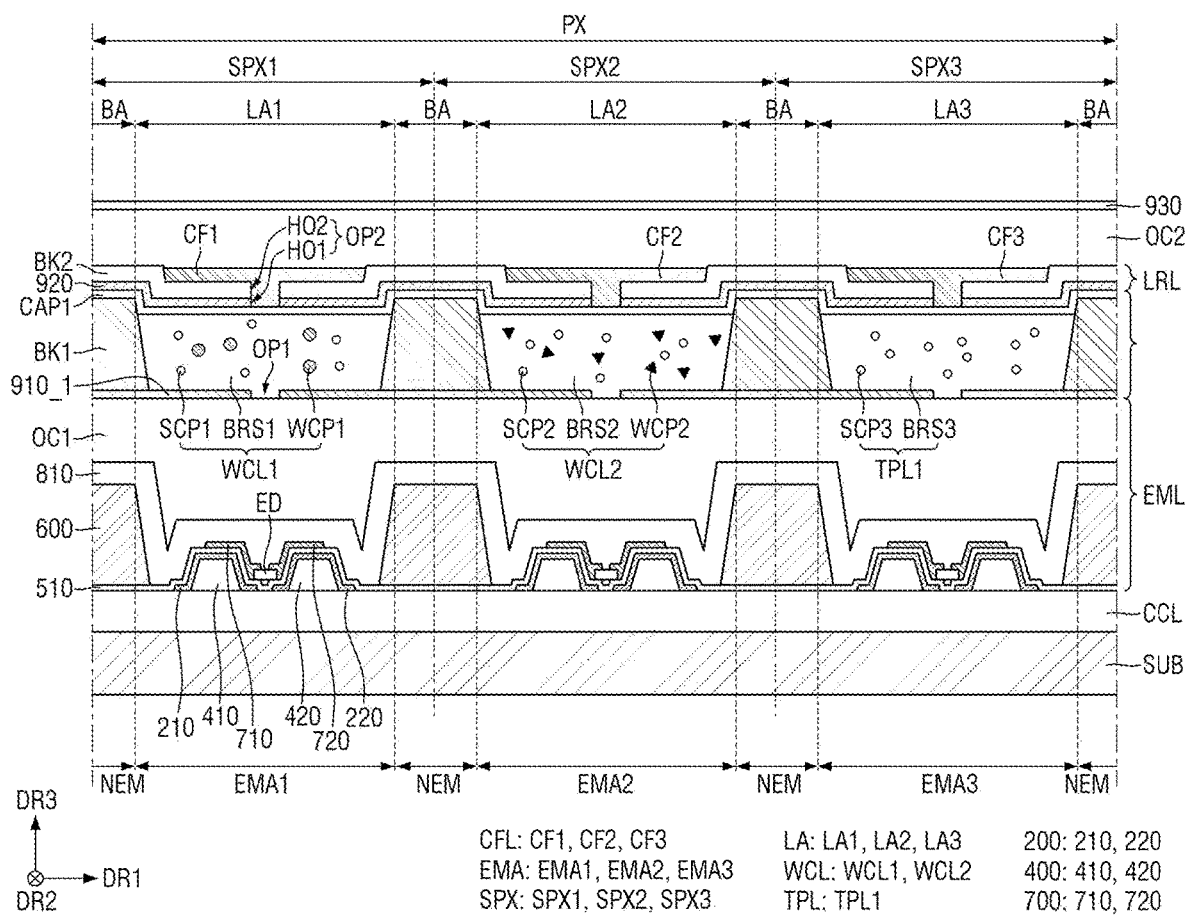
FIG. 28 is a schematic cross-sectional view schematically illustrating a pixel of a display device according to yet another embodiment of the disclosure.

FIG. 28 is a cross-sectional view schematically illustrating a pixel of a display device according to yet another embodiment of the disclosure.

The embodiment of FIG. 28 is different from the embodiment of FIG. 2 in that a third color filter CF3 is further disposed in a third light exit area LA3 of a third sub-pixel SPX3.

The color filter layer CFL may include a first color filter CF1, a second color filter CF2, and a third color filter CF3. The third color filter CF3 may be disposed in the third light exit area LA3. The third color filter CF3 may be surrounded by the upper reflective layer 920 and the second light-blocking member BK2, and may cover at least part of the upper reflective layer 920 and the second light-blocking member BK2 disposed in the third light exit area LA3. The third color filter CF3 may overlap a first transparent pattern TPL1 in the thickness direction. The third color filter CF3 may be a blue color filter. The third color filter CF3 may be different from the first color filter CF1 and the second color filter CF2. According to this embodiment, by further disposing the third color filter CF3 in the third light exit area LA3, the color gamut of each of the sub-pixels PX of the display device 10 can be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a substrate;
a plurality of light-emitting elements disposed on the substrate;
a planarization layer disposed on the plurality of light-emitting elements;
a lower reflective layer disposed on the planarization layer and comprising a first opening overlapping the plurality of light-emitting elements in a plan view;
a wavelength conversion layer disposed on the lower reflective layer;
a functional layer disposed on the wavelength conversion layer and comprising a second opening overlapping the first opening in a plan view; and
a capping layer disposed on the functional layer, wherein
the functional layer comprises an upper reflective layer disposed on the wavelength conversion layer, the upper reflective layer being entirely separated from the lower reflective layer by the wavelength conversion layer, and
the capping layer is disposed between the upper reflective layer and the wavelength conversion layer.

2. The display device of claim 1, wherein the functional layer further comprises:
a first light-blocking member disposed on the upper reflective layer, wherein
the upper reflective layer comprises a first hole overlapping the first opening in a plan view,
the first light-blocking member comprises a second hole overlapping the first hole in a plan view, and
the second opening comprises the first hole and the second hole.

3. The display device of claim 2, further comprising:
a second light-blocking member disposed on the planarization layer and surrounding the wavelength conversion layer,
wherein the functional layer is disposed on the second light-blocking member.

4. The display device of claim 3, wherein the second light-blocking member is disposed on the lower reflective layer.

5. The display device of claim 3, wherein the second light-blocking member surrounds the lower reflective layer.

6. The display device of claim 1, wherein a shape of the first opening is identical to a shape of the second opening in a plan view.

7. The display device of claim 1, wherein
an area of the second opening is less than or equal to an area of the first opening.

8. The display device of claim 1, further comprising:
a plurality of electrodes disposed on the substrate and spaced apart from each other;
wherein
the plurality of electrodes comprises a first electrode and a second electrode extended in a first direction and spaced apart from each other in a second direction intersecting the first direction,
the plurality of light-emitting elements comprises first light-emitting elements spaced apart from each other in the first direction in a first alignment area between the first electrode and the second electrode, and
the first opening and the second opening overlap the first alignment area in a plan view.

9. The display device of claim 8, wherein
a shape of the first alignment area has a shape extended in the first direction in a plan view, and
a shape of the first opening or the second opening has a shape extended in the first direction in a plan view.

10. The display device of claim 8, wherein
the plurality of electrodes comprises a third electrode extended in the first direction and spaced apart from the first electrode and the second electrode in the second direction with the second electrode disposed between the first and third electrode,
the plurality of light-emitting elements comprises second light-emitting elements spaced apart from each other in the first direction in a second alignment area between the second electrode and the third electrode, and
the first opening and the second opening overlap the second alignment area in a plan view.

11. The display device of claim 10, wherein
the second alignment area is spaced apart from the first alignment area and has a shape extended in the first direction, and
the first opening and the second opening has a shape of stripes extended in the first direction and spaced apart from each other in the second direction.

12. A display device comprising:
an emission layer disposed on a substrate and comprising a plurality of light-emitting elements disposed in first and second alignment areas;
a wavelength control layer disposed above the emission layer and comprising:
a lower reflective layer; and
a wavelength conversion layer;
an upper reflective layer disposed on the wavelength control layer; and
a capping layer disposed between the upper reflective layer and the wavelength conversion layer, wherein
the lower reflective layer comprises a first opening overlapping the first and second alignment area in a plan view,
the wavelength conversion layer is disposed on the lower reflective layer in first and second light exit areas overlapping the first and second alignment areas in a plan view, respectively,
the upper reflective layer comprises a first hole overlapping the first opening in a plan view, the upper reflective layer being entirely separated from the lower reflective layer by the wavelength conversion layer, and
an area of the first hole is equal to or less than an area of the first opening.

13. The display device of claim 12, further comprising:
a first light-blocking member disposed on the upper reflective layer and comprising a second hole overlapping each of the first and second alignment areas in a plan view,
wherein the first hole and the second hole overlap each other in a plan view.

14. The display device of claim 13, wherein
the emission layer further comprises a third alignment area in which the plurality of light-emitting elements is disposed,
the wavelength control layer further comprises:
a transparent layer disposed in a third light exit area overlapping the third alignment area in a plan view; and
a second light-blocking member disposed in a light-blocking area surrounding the first to third light exit areas, and the second light-blocking member surrounds the wavelength conversion layer and the transparent layer.

15. The display device of claim 14, wherein the lower reflective layer is disposed in the first to third light exit areas and the light-blocking area.

16. The display device of claim 15, wherein the second light-blocking member is disposed on the lower reflective layer.

17. The display device of claim 14, wherein the lower reflective layer is disposed in the first to third light exit areas but not in the light-blocking area.

18. The display device of claim 17, wherein the second light-blocking member surrounds the lower reflective layer.

19. The display device of claim 14, wherein the lower reflective layer is disposed in the first and second light exit areas but not in the third light exit area or in the light-blocking area.

20. The display device of claim 12, wherein
the emission layer further comprises a first electrode and a second electrode disposed on the substrate, extended in a first direction, and spaced apart from each other in a second direction intersecting the first direction,
the light-emitting elements are spaced apart from each other in the first direction between the first electrode and the second electrode, and
the first opening has a shape extended in the first direction or a shape of dots spaced apart from each other in the first direction in a plan view.

21. A display device comprising:
an emission layer comprising an alignment area in which a plurality of light-emitting elements is disposed on a substrate;
a lower reflective layer disposed on the emission layer;
a wavelength conversion layer disposed on the lower reflective layer;
an upper reflective layer disposed on the wavelength conversion layer and comprising a first hole overlapping the alignment area in a plan view, the upper reflective layer being entirely separated from the lower reflective layer by the wavelength conversion layer;
a light-blocking member disposed on the upper reflective layer and comprising a second hole overlapping the first hole in a plan view;
a color filter layer disposed on the light-blocking member; and
a capping layer disposed between the upper reflective layer and the wavelength conversion layer.

22. The display device of claim 21, wherein
the lower reflective layer comprises a first opening overlapping the alignment area in a plan view.

23. The display device of claim 22, wherein
the first hole and the second hole have a same shape in a plan view, and
the first hole and the second hole overlap the first opening in a plan view.

24. The display device of claim 21, wherein
side surfaces of the upper reflective layer define the first hole, and
the color filter layer directly contacts the side surfaces of the upper reflective layer.

* * * * *